(12) United States Patent
Aoyama et al.

(10) Patent No.: US 7,365,566 B2
(45) Date of Patent: Apr. 29, 2008

(54) PROGRAMMABLE LOGIC CIRCUIT

(75) Inventors: Yasuhiro Aoyama, Tokyo (JP); Yosuke Kudo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/589,078

(22) PCT Filed: Feb. 8, 2005

(86) PCT No.: PCT/JP2005/001837

§ 371 (c)(1),
(2), (4) Date: Jun. 18, 2007

(87) PCT Pub. No.: WO2005/078933

PCT Pub. Date: Aug. 25, 2005

(65) Prior Publication Data

US 2007/0279085 A1 Dec. 6, 2007

(30) Foreign Application Priority Data

Feb. 12, 2004 (JP) .............................. 2004-035042
Feb. 12, 2004 (JP) .............................. 2004-035043

(51) Int. Cl.
*H03K 19/177* (2006.01)
*G06F 7/38* (2006.01)

(52) U.S. Cl. .............................. 326/39; 326/38; 326/41

(58) Field of Classification Search ............. 326/38–41
See application file for complete search history.

(56) References Cited

U.S. PATENT DOCUMENTS 4,870,302 A 9/1989 Freeman
5,596,743 A 1/1997 Bhat et al.
6,404,224 B1 * 6/2002 Azegami et al. ............... 326/38
6,633,181 B1 * 10/2003 Rupp ........................... 326/40

FOREIGN PATENT DOCUMENTS

| JP | 8250685 | 9/1996 |
| JP | 8510885 | 11/1996 |
| JP | 85108855 T | 11/1996 |
| JP | 200168993 | 3/2001 |
| JP | 2004310730 | 11/2004 |

OTHER PUBLICATIONS

PCT International Search Report dated Apr. 12, 2005.

* cited by examiner

*Primary Examiner*—Anh Q. Tran
(74) *Attorney, Agent, or Firm*—Dickinson Wright, PLLC

(57) ABSTRACT

A programmable logic circuit (100) includes a processor element (101) having: a logic cell (300) which can modify the function according to first setting information and generates data by performing a predetermined logic calculation on an input signal; a cross connect switch (301) for generating data by performing alignment, copying, and inversion of the data from the logic calculation means according to second setting information; and a memory control unit (201) which reads out the first or the second setting information from a memory device (102) according to branch setting information and supplies it to the logic calculation means and the data processing means for performing control. According to the first and the second setting information successively read from the memory device (102), each of unit logic circuits successively modifies a part or whole of the logic cell (300) and the cross connect switch (301) and performs a predetermined sequence circuit operation.

18 Claims, 24 Drawing Sheets

| | SETTING INFORMATION | | | |
|---|---|---|---|---|
| | | 00 | 01 | 10 | 11 |
| INPUT DATA | 00 | 0 | 0 | 0 | 1 |
| | 01 | 1 | 0 | 1 | 0 |
| | 10 | 1 | 0 | 1 | 0 |
| | 11 | 1 | 1 | 0 | 0 |

| SETTING INFORMATION | OUTPUT DATA | |
|---|---|---|
| | OUT1 | OUT2 |
| 0000 | A | A |
| 0001 | A | B |
| 0010 | A | C |
| 0011 | A | O |
| 0100 | B | A |
| 0101 | B | B |
| 0110 | B | C |
| 0111 | B | O |
| 1000 | C | A |
| 1001 | C | B |
| 1010 | C | C |
| 1011 | C | O |
| 1100 | O | A |
| 1101 | O | B |
| 1110 | O | C |
| 1111 | O | O |

FIG.8

|  | SETTING INFORMATION | | | |
|---|---|---|---|---|
|  | 00 | 01 | 10 | 11 |
| INPUT DATA 00 | 01 | 01 | 01 | 00 |
| 01 | 10 | 01 | 10 | 01 |
| 10 | 10 | 01 | 10 | 10 |
| 11 | 10 | 10 | 01 | 11 |

FIG.11

PROGRAMMABLE LOGIC CIRCUIT

TECHNICAL FIELD

The present invention relates to a programmable logic circuit capable of implementing functions for predetermined logic operations as a result of programming, and particularly relates to a dynamic programmable logic circuit capable of carrying out processing while dynamically changing internal configuration.

BACKGROUND ART

As a programmable logic circuit of the related art, there is a one disclosed in Japanese patent document 1. This programmable logic circuitry of the related art consists of dynamically reconfigurable field-programmable logic devices employing dynamically connected arrays, latch circuits, and dynamic logic cores that are gradually being executed in circuits. With programmable logic circuits of the related art, in the case of implementing large scale logic circuits, a plurality of the programmable logic circuits are connected in series, and logic processing of each level is executed sequentially.

In this case, with programmable logic circuits of the related art, control is performed such that when an internal level of a first chip reaches a specified level, a next chip is operated using a circuit level counter indicating the circuit level and an internal counter indicating the internal level. Namely, programmable logic circuits of the related art are implemented in such a manner that circuit level is divided in chip units. Patent Document 1: Japanese Patent Application Laid-Open No. Hei 8-510885.

DISCLOSURE OF INVENTION

Problems to be Solved by the Invention

However, with programmable logic circuits of the related art, when a large scale logic circuit is implemented, there is a problem in that processing time increases because the extent to which parallel processing can be adopted is limited to what can be achieved with a single chip. Further, with programmable logic circuits of the related art, when the extent of parallel processing is increased by increasing the number of dynamic logic modules contained on a single chip sequentially to shorten processing time, connection points of dynamically connected arrays and required setting information increase proportionally with this, and there is therefore a problem that the implementation area for the circuit increases.

In view of the foregoing problems, it is an object of the present invention to provide a low-cost programmable logic circuit having a high implementation area efficiency capable of bringing about high-speed, large scale logic circuits.

Means for Solving the Problem

A first aspect of the present invention adopts a configuration having a plurality of unit logic circuits connected in parallel; an input signal control section that supplies input signals received from outside to the plurality of unit logic circuits; and an output signal control section that supplies output signals of the plurality of unit logic circuits to outside, each of the plurality of unit logic circuits comprising: a logic operation section that performs predetermined logic operation on the input signals and generates data, the logic operation section having functions that are changeable based on first setting information; a data processing section that generates data by carrying out arrangement, duplication and inversion processing on the data from the logic operation section based on second setting information, and provides the data to the output signal control section as output signals; a storage section that stores the first and second setting information; and a memory control section that takes control by receiving jump setting information, reading out either the first or the second setting information of the storage section based on the jump setting information and providing the setting information to the logic operation circuit and the data processing section, where each of the plurality of unit logic circuits sequentially changes some or all of the functions of the logic operation section and the data processing section based on the first and second setting information read out sequentially from the storage section and carries out predetermined operations of a sequential circuit.

A second aspect of the present invention adopts a configuration having a plurality of unit logic circuits connected in parallel; an input signal control section that supplies input signals received from outside to the plurality of unit logic circuits; and an output signal control section that supplies output signals of the plurality of unit logic circuits to outside, each of the plurality of unit logic circuits comprising: a logic operation section that performs predetermined logic operation on the input signal and generates data, the logic operation section having functions that are changeable based on first setting information; a data processing section that generates data by carrying out arrangement, duplication and inversion processing on the data from the logic operation section based on the second setting information, and provides the data to the output signal control section as output signals; a storage section that stores the first and second setting information; and a memory control section that receives stopping setting information and controls stopping between the logic operation section and the data processing section based on the stopping setting information, wherein each of the plurality of unit logic circuits sequentially changes some or all of the functions of the logic operation section and the data processing section based on the first and second setting information read out sequentially from the storage section and carries out predetermined operations of a sequential circuit.

A third aspect of the present invention adopts a configuration having a plurality of unit logic circuits connected in parallel; an input signal control section that supplies input signals received from outside to the plurality of unit logic circuits; a connecting section that connects one unit logic circuit in the plurality of unit logic circuits and another unit logic circuit neighboring the one unit logic circuit in physical arrangement; and an output signal control section that supplies output signals of the plurality of unit logic circuits to outside, each of the plurality of unit logic circuits comprising: a logic operation section that performs predetermined logic operation on one of the input signal and data from the another neighboring unit logic circuit, and generates data, the logic operation section having functions that are changeable based on the first setting information; a data processing section that generates data by carrying out arrangement, duplication and inversion processing on the data from the logic operation section based on the second setting information, and provides the data to the output signal control section as output signals; a storage section that stores the first and second setting information; and a memory control section that takes control by receiving jump setting information, reading out either the first or the second setting information of the storage section based on the jump setting information and providing the setting information to the logic operation circuit and the data processing section, where each of the plurality of unit logic circuits sequentially changes some or all of the functions of the logic operation section and the data processing section based on the first and second setting information read out sequentially from the storage section and carries out predetermined operations of a sequential circuit.

A fourth aspect of the present invention adopts a configuration having a plurality of unit logic circuits connected in parallel; an input signal control section that supplies input signals received from outside to the plurality of unit logic circuits; a connecting section that connects one unit logic circuit and another unit logic circuit neighboring the one unit logic circuit in physical arrangement in the plurality of unit logic circuits; and an output signal control section that supplies output signals of the plurality of unit logic circuits to outside, each of the plurality of unit logic circuits comprising: a logic operation section that performs predetermined logic operation on one of the input signal and data from the another neighboring unit logic circuit, and generates data, the logic operation section having functions that are changeable based on the first setting information; a data processing section that generates data by carrying out arrangement, duplication and inversion processing on the data from the logic operation section based on the second setting information, and provides the data to the output signal control section as the output signals; a storage section that stores the first and second setting information; and a memory control section that receives stopping setting information and controls stopping between the logic operation section and the data processing section based on the stopping setting information, where each of the plurality of unit logic circuits sequentially changes some or all of the functions of the logic operation section and the data processing section based on the first and second setting information read out sequentially from the storage section and carries out predetermined operations of a sequential circuit.

A fifth aspect of the present invention adopts a configuration having a plurality of unit logic circuits connected in parallel; an input signal control section that supplies input signals received from outside to the plurality of unit logic circuits; and an output signal control section that supplies output signals of the plurality of unit logic circuits to outside, the input signal control section comprising: a section that supplies a control signal to the plurality of unit logic circuits based on the input signal; and a section that supplies index information to the plurality of unit logic circuits at the time of receiving an index designation signal, each of the plurality of unit logic circuits comprising: a logic operation section that performs predetermined logic operation on the input signal and generates data, the logic operation section having functions that are changeable based on any of the first setting information; a data processing section that generates data by carrying out arrangement, duplication and inversion processing on the data from the logic operation section based on any of the second setting information and provides the data to the output signal control section as the output signals; a storage section storing the first and second setting information; and a memory control section that stores a lead position address indicating the lead position of storage position addresses of the first and second setting information at the storage section based on one of the control signal and index information at the time of receiving one of the control signal and the index information, where each of the plurality of unit logic circuits sequentially changes some or all of the functions of the logic operation section and the data processing section based on one of the first and second setting information read out sequentially from the storage section based on the lead position address stored in the memory control section and carries out predetermined operations of a sequential circuit.

A sixth aspect of the present invention adopts a configuration having a plurality of unit logic circuits connected in parallel; a connecting section that connects one unit logic circuit and another unit logic circuit neighboring the one unit logic circuit in physical arrangement in the plurality of unit logic circuits; an input signal control section that supplies input signals received from outside to the plurality of unit logic circuits; and an output signal control section that supplies output signals of the plurality of unit logic circuits to outside, the input signal control section comprising: a section that supplies a control signal to the plurality of unit logic circuits based on the input signal; and a section that supplies index information to the plurality of unit logic circuits at the time of receiving an index designation signal, and each of the plurality of unit logic circuits comprising: a logic operation section performs predetermined logic operation on the input signal or data from the another neighboring unit logic circuit and generates data, the logic operation section having functions that are changeable based on any of the first setting information; a data processing section that generates data by carrying out arrangement, duplication and inversion processing on the data from the logic operation section based on any of the second setting information and provides the data to the output signal control section as the output signals; a storage section that stores the first and second setting information; and a memory control section that stores a lead position address indicating the lead position of storage position addresses of the first and second setting information at the storage section based on one of the control signal and index information at the time of receiving one of the control signal and the index information, where each of the plurality of unit logic circuits sequentially changes some or all of the functions of the logic operation section and the data processing section based on one of the first and second setting information read out sequentially from the storage section based on the lead position address stored in the memory control section and carries out predetermined operations of a sequential circuit.

Advantageous Effect of the Invention

According to the present invention, it is possible to provide a low-cost programmable logic circuit having a high implementation area efficiency capable of bringing about high-speed, large scale logic circuits.

BRIEF DESCRIPTION OF DRAWINGS

FIG. 8 is a view illustrating the operation of a cross-connecting switch of a processor element for a programmable logic circuit of the first embodiment of the present invention.

FIG. 11 is a view illustrating the operation of a logic cell at a logic element of a processor element for a programmable logic circuit of the first embodiment of the present invention.

BEST MODE FOR CARRYING OUT THE INVENTION

Embodiments of the present invention will be described below in detail with reference to the accompanying drawings.

First Embodiment

Figure 1:
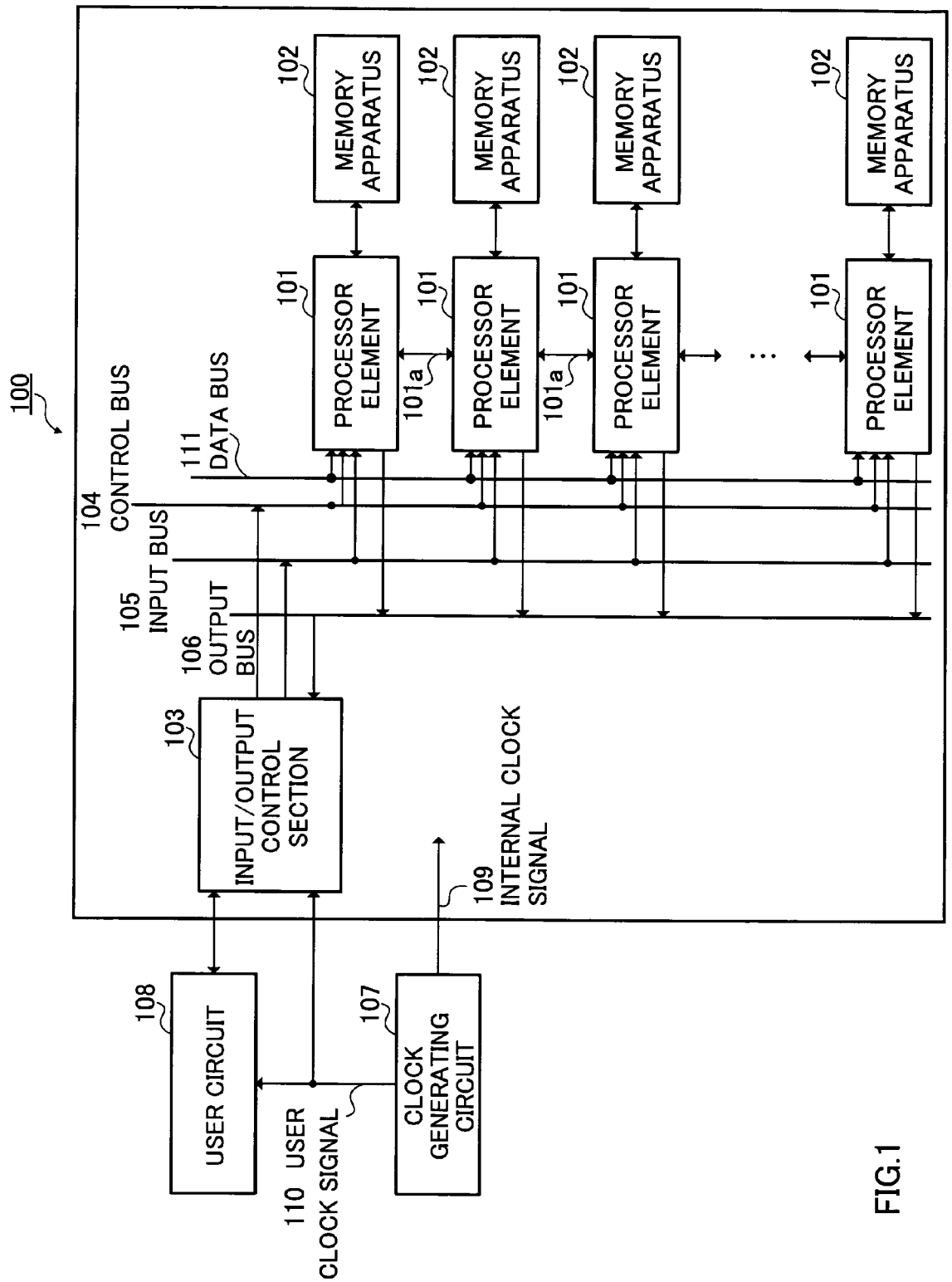
FIG. 1 is a block diagram showing a configuration of a programmable logic circuit of a first embodiment of the present invention.

FIG. 1 is a block diagram showing a configuration of a programmable logic circuit of a first embodiment of the present invention.

As shown in FIG. 1, programmable logic circuit 100 of the first embodiment of the present invention provides a plurality of processor elements 101, a plurality of memory apparatus 102, input/output control section 103, control bus 104, input bus 105, and output bus 106. Clock generating circuit 107 and user circuit 108 are connected to programmable logic circuit 100.

The plurality of processor elements 101 and the plurality of memory apparatus 102 are connected so as to be individually paired together. Processor element 101 and memory apparatus 102 connected so as to be individually paired together constitute a unit logic circuit. A plurality of unit logic circuits are connected together in parallel.

Each of the plurality of processor elements 101 are arranged in a single row-shape in one dimension, and connected to two other processor elements 101 that are neighboring in physical arrangement by connecting wire 101a. Namely, the plurality of unit logic circuits are arranged in a single row-shape in one dimension, and one unit logic circuit and another unit logic circuit neighboring the one logic circuit in physical arrangement in the plurality of unit logic circuits are connected by connecting wire 101a.

Processor element 101 then exchanges data with two neighboring other processor elements 101 using the connecting wire.

Input/output control section 103 is a circuit for interfacing with outside and is connected to user circuit 108. Control bus 104 connects input/output control section 103 and processor elements 101. Control bus 104 receives control signals for, for example, initialization and activation from input/output control section 103 and transfers these signals to each processor element 101. Input bus 105 connects input/output control section 103 and processor elements 101. Input bus 105 receives data used in logic operations from input/output control section 103 and transfers this data to each processor element 101.

Output bus 106 connects input/output control section 103 and processor elements 101. Output bus 106 receives data for operation results from processor elements 101 and transfers this data to input/output control section 103. Clock generating circuit 107 generates internal clock signal 109 and user clock signal 110. User clock signal 110 is used in user circuit 108 and input/output control section 103. Internal clock signal 109 is a frequency that is a multiple of the user clock signal 110 and is used within programmable logic circuit 100.

Next, a description is given with reference to a drawing with regards to functions of this programmable logic circuit 100.

In FIG. 1, content of logic operation carried out by programmable logic circuit 100 is held as setting information in memory apparatus 102. Each processor element 101 reads out setting information from memory apparatus 102 sequentially and carries out corresponding logic operation. Programmable logic circuit 100 receives data used as activation signals and for logic operations in synchronization with user clock signal 110 from user circuit 108. After a subsequent fixed period of time elapses, programmable logic circuit 100 provides the data after logical operation to user circuit 108 in synchronization with user clock signal 110.

Next, a description is given with reference to the drawings with regards to functions of the internal clock of programmable logic circuit 100.

In FIG. 1, setting information of neighboring processor elements 101 is stored in each memory apparatus 102. When the control signal and memory address are input from processor elements 101, memory apparatus 102 provides setting information designated by the address to the processor elements 101. Processor element 101 then determines the content of processing to be executed based on this setting information.

When an initialization signal is input by control bus 104, processor element 101 reads out a specific address of memory apparatus 102, and extracts and holds a storage position address of setting information from the input readout data. This storage position address is an address indicating the lead position of the setting information.

Further, when an activation signal is input by control bus 104, processor elements 101 reads out the setting information sequentially from the storage position address held in memory apparatus 102. Moreover, processor element 101 receives data for logic processing use from input bus 105 and neighboring processor elements 101, and after carrying out logic processing on data based on setting information, performs arrangement, duplication, and inversion processing on the data and holds the data after processing. Further, processor elements 101 output the data held after processing to output bus 106 and neighboring processor elements 101.

In this way, the plurality of processor elements 101 hand over the data. Input/output control section 103 receives the activation signal synchronized with user clock signal 110 and data for logic processing use from user circuit 108, and provides this data to input bus 105 in synchronization with internal clock signal 109. Further, input/output control section 103 receives the initialization signal synchronized with user clock signal 110 from user circuit 108 and outputs this data to input bus 105 in synchronization with internal clock signal 109. Further, input/output control section 103 receives data after logic processing in synchronization with internal clock signal 109 from output bus 106 and outputs this data to user circuit 108 in synchronization with user clock signal 110. In this way, input/output control section 103 hands over a control signal and data for logic processing use and for processing results to user circuit 108.

Next, a description is given with reference to a drawing of a configuration of the processor elements 101 within programmable logic circuit 100.

Figure 2:
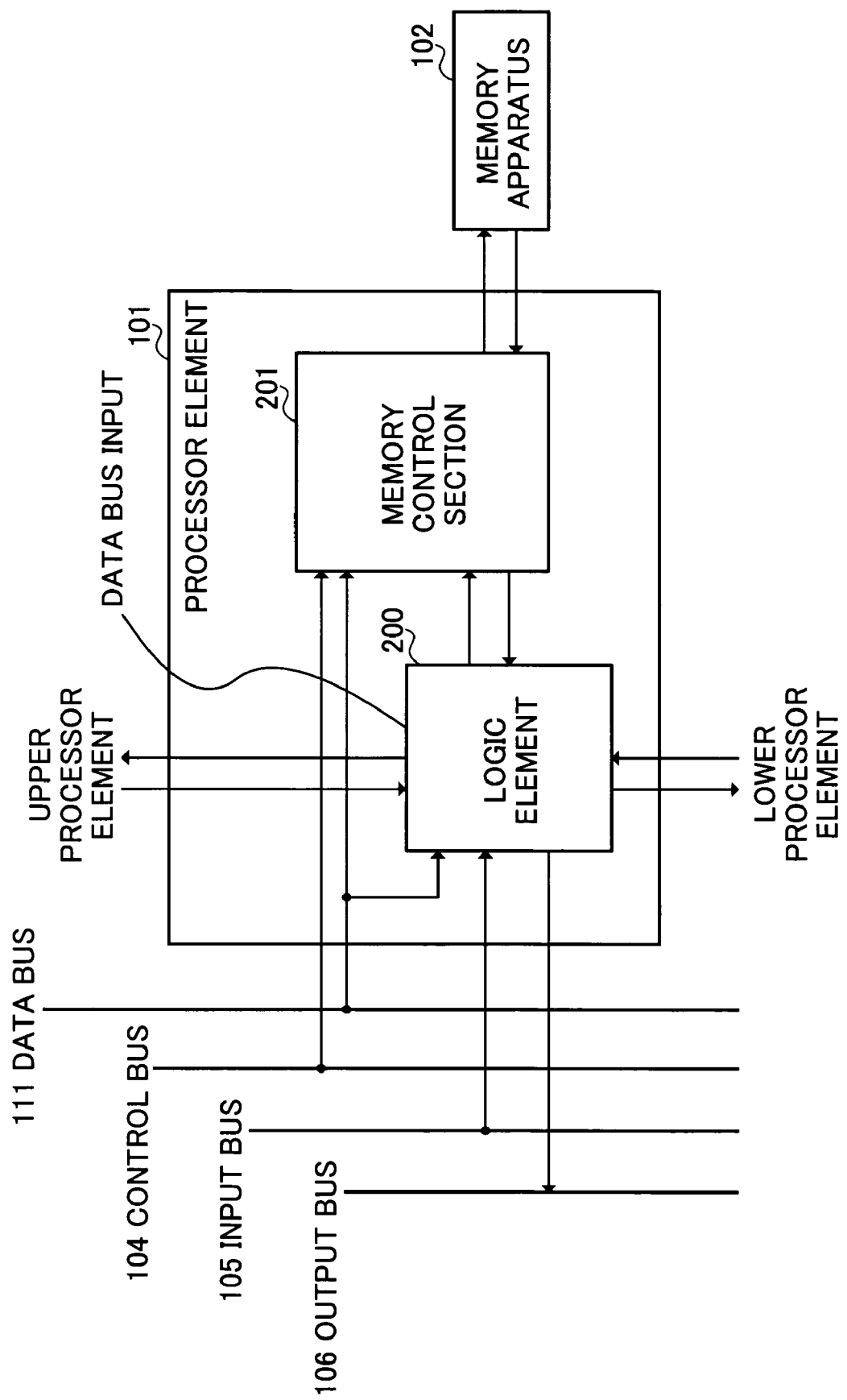
FIG. 2 is a block diagram showing a configuration of a processor element of a programmable logic circuit of the first embodiment of the present invention.

FIG. 2 shows a configuration of processor element 101. As shown in FIG. 2, processor element 101 provides a logic element 200 and memory control section 201. Processor element 101 is connected to memory apparatus 102, control bus 104, input bus 105 and output bus 106. Memory control section 201 is connected to memory apparatus 102, logic element 200, control bus 104, and data bus 111. Logic element 200 is connected to logic element 200 and memory control section 201, input bus 105, output bus 106 and data bus 111 of neighboring processor element 101.

Next, a description is given with reference to a drawing of the functions of processor elements 101. In FIG. 2, upon receiving the initialization signal from control bus 104, memory control section 201 carries out processing to extract and hold the storage position address described previously. When an activation signal is input from control bus 104, memory control section 201 reads out setting information sequentially from the storage position address held in memory apparatus 102 and transfers this setting information to logic element 200.

Logic element 200 receives data from input bus 105 and neighboring processor elements 101, and after carrying out logic processing on data based on setting information transferred from memory control section 201, performs arrangement, duplication, and inversion processing on the data and holds the data after processing. Moreover, logic element 200 outputs data after processing to output bus 106 and neighboring processor elements 101 based on setting information transferred from memory control section 201.

Next, a description is given with reference to the drawings of a structure for logic elements 200 within processor elements 101 and a configuration of setting information.

Figure 3:
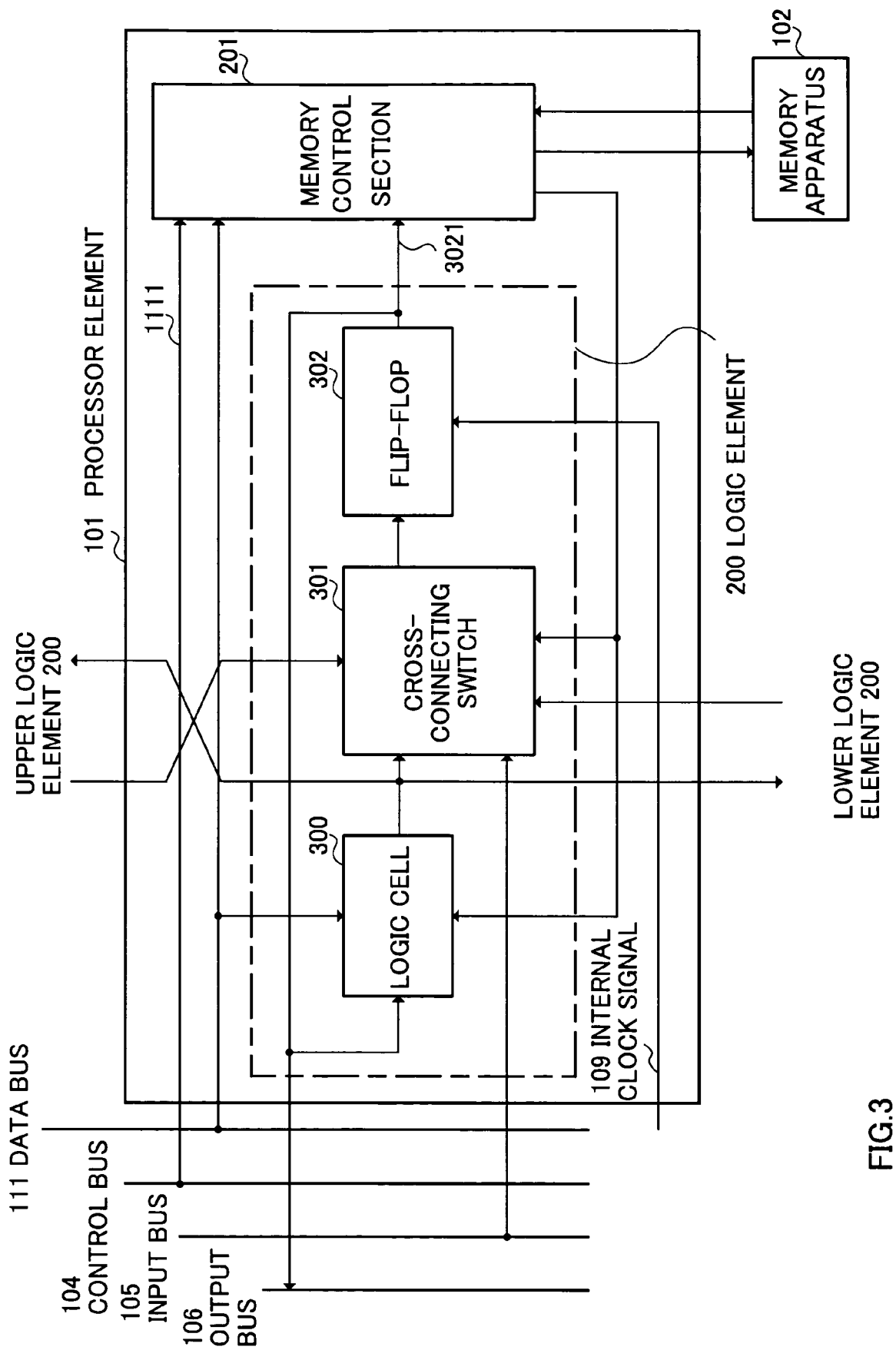
FIG. 3 is a block diagram showing a configuration of a logic element of a processor element for a programmable logic circuit of the first embodiment of the present invention.

A configuration of logic element 200 is shown in FIG. 3. Configurations of setting information and memory apparatus 102 are shown in FIG. 4.

In FIG. 3, logic element 200 has a logic cell 300, cross-connecting switch 301 and flip-flop 302. Logic element 200 is connected to memory control section 201, input bus 105, and output bus 106. Logic cell 300 is connected to memory control section 201, flip-flop 302, and cross-connecting switch 301. Cross-connecting switch 301 is connected to memory control section 201, logic cell 300, flip-flop 302, input bus 105 and logic cell 300 within neighboring logic element 200. Flip-flop 302 is connected to logic cell 300, cross-connecting switch 301, output bus 106 and memory control section 201.

Logic cell 300 constitutes a logic operation circuit. Further, cross-connecting switch 301 constitutes data processing apparatus. Moreover, cross-connecting switch 301 and flip-flop 302 constitute data processing apparatus.

Figure 4:
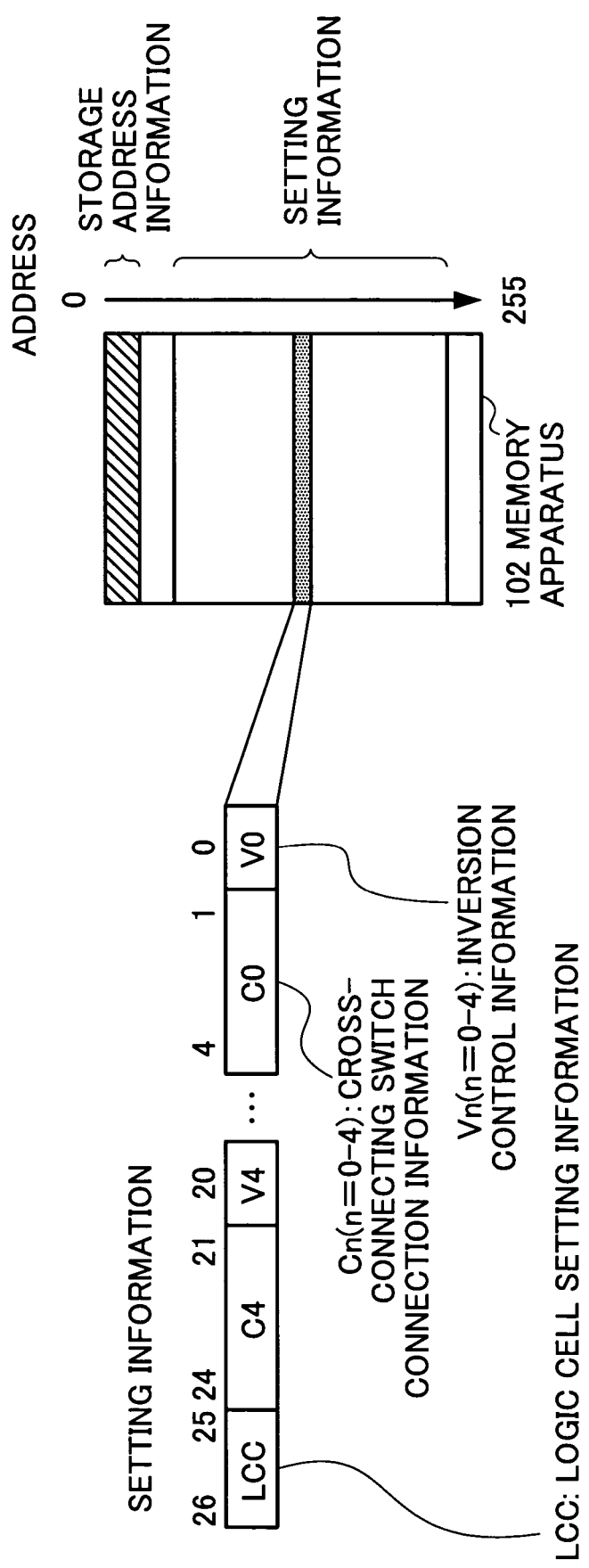
FIG. 4 is a view illustrating setting information and a memory apparatus configuration of a programmable logic circuit of the first embodiment of the present invention.

FIG. 4 shows a configuration of a memory apparatus. In FIG. 4, storage address information of setting information is stored at a leading portion within memory apparatus 102. Setting information is stored in specific regions other than the leading portion within memory apparatus 102.

In FIG. 4, bits 25 to 26 are setting information of logic cell 300, and bits 0 to 24 are setting information of cross-connecting switch 301. Bits 0 to 24 are in five units, each unit having a configuration including four bits of connection information and one bit of inversion control information corresponding to the five outputs of cross-connecting switch 301.

Next, a description is given with reference to a drawing of the functions of logic element 200. In FIG. 3, logic cell 300 carries out specific logic processing designated by the setting information transferred from memory control section 201 on data input from flip-flop 302, and outputs data after processing to cross-connecting switch 301 and logic element 200 of neighboring processor element 101. Cross-connecting switch 301 then carries out arrangement, duplication, and inversion processing on specific data designated by setting information transferred by memory control section 201 on data input from logic cell 300, input bus 105, and logic element 200 of neighboring processor element 101, and outputs data after processing to flip-flop 302. Flip-flop 302 holds data input by cross-connecting switch 301 at the timing of internal clock signal 109. Flip-flop 302 outputs the held data to logic cell 300 and output bus 106.

Next, a description is given of the functions and operations of logic cell 300 using specific examples.

Figures 5, 6:
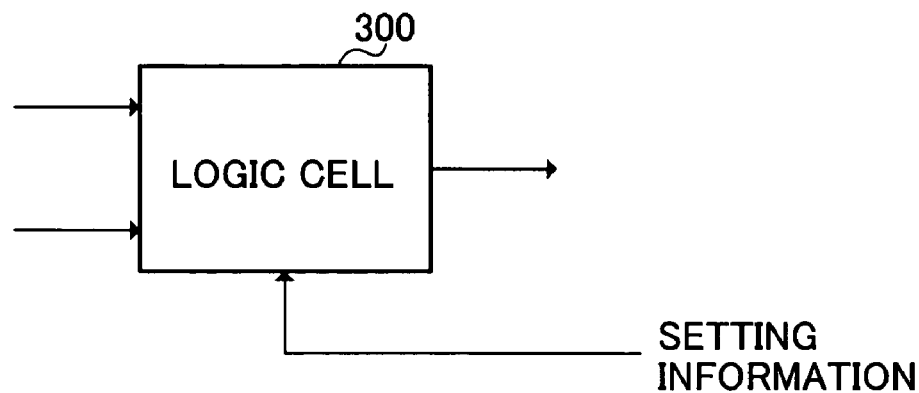
FIG. 5 is a block diagram illustrating functions of a logic cell at a logic element of a processor element for a programmable logic circuit of the first embodiment of the present invention.
FIG. 6 is a view illustrating the operation of a logic cell at a logic element of a processor element for a programmable logic circuit of the first embodiment of the present invention.

In FIG. 5, two bits of setting information and two bits of input data are input to logic cell 300, and logic cell 300 outputs one bit of output data. FIG. 6 shows an example of the functions and operations of logic cell 300 in this case. In FIG. 6, logic cell 300 outputs a logical or (OR) for input data when the setting information is "00." Logic cell 300 outputs a logical and (AND) for input data when the setting information is "01." Logic cell 300 outputs an exclusive or (XOR) for input data when the setting information is "10." Logic cell 300 outputs an inverted or (NOR) data for input data when the setting information is "11." In this way, logic cell 300 is a circuit capable of implementing a plurality of different logic functions based on the setting information.

Next, a description is given of functions of cross-connecting switch 301 using a specific example.

Figure 7:
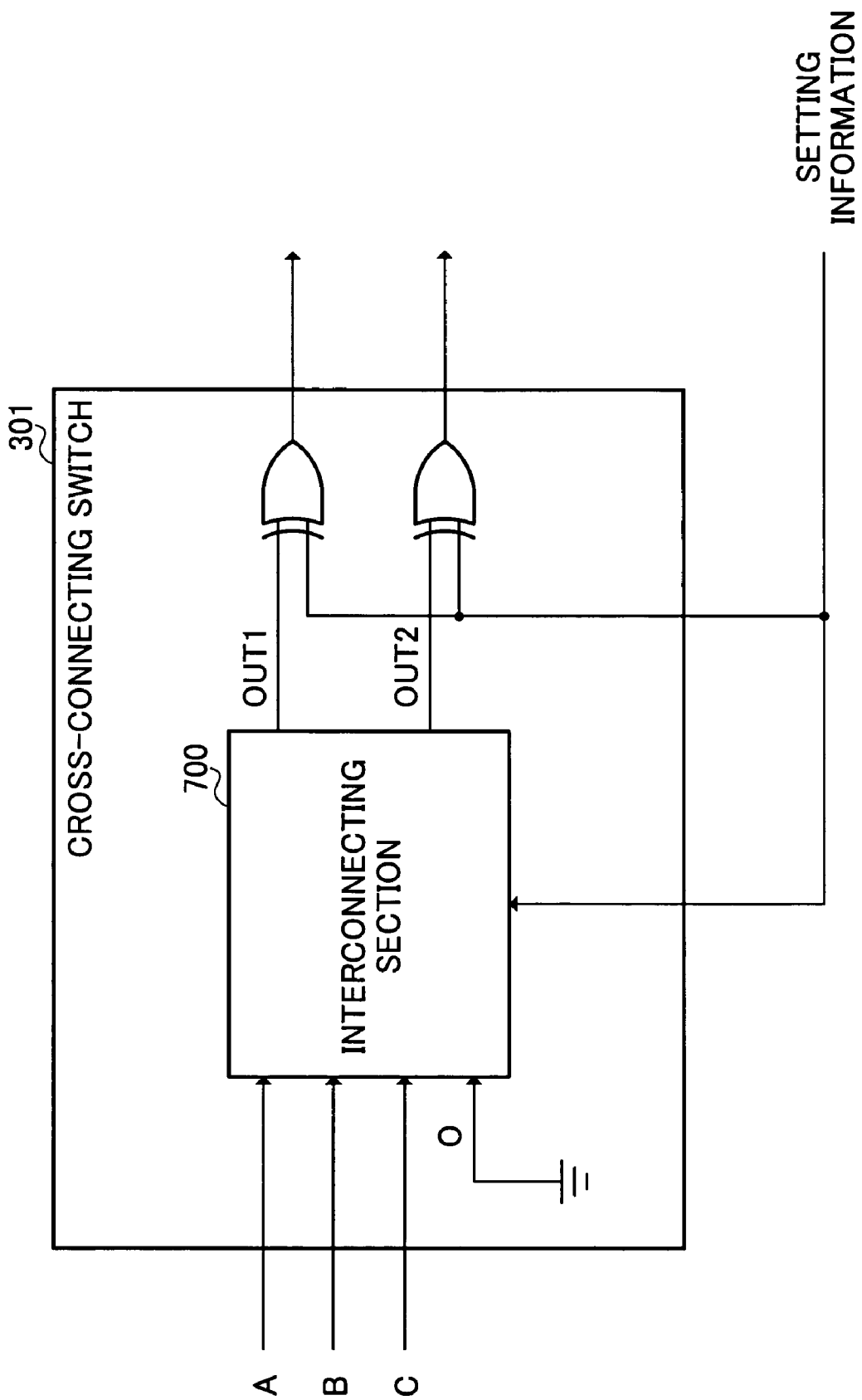
FIG. 7 is a block diagram showing a configuration of a cross-connecting switch of a processor element for a programmable logic circuit of the first embodiment of the present invention.

FIG. 7 shows examples of internal blocks and the functions of cross-connecting switch 301. In FIG. 7, four bits of setting information, three bits of input data A, B, C, and a low level are input to interconnecting section 700 within cross-connecting switch 301, and two bits of output data OUT1, OUT2 are output from interconnecting section 700. Further, each item of output data of interconnecting section 700 is subjected to an exclusive or operation (XOR) together with one bit of setting information, and output to outside. This XOR inverts output data from cross-connecting switch 301 in bit units based on the setting information. In this case, as the number of outputs is two, two bits of setting information are used at the XOR section, so that the setting information used at overall cross-connecting switch 301 is six bits in total.

FIG. 8 shows an example of the functions of interconnecting section 700 in this case. In FIG. 8, interconnecting section 700 selects data where two bits of the MSB of the setting information are output to OUT1, and selects data where two bits of the LSB are output to OUT2. Interconnecting section 700 outputs input data A when setting information is "00," and outputs input data B when setting information is "01." Interconnecting section 700 outputs input data C when setting information is "10," and outputs a low level when setting information is "11."

In this way, cross-connecting switch 301 is a circuit capable of carrying out arrangement, duplication and inversion processing on a plurality of items of input data based on setting information, and outputting fixed values set in the setting information.

Figure 9:
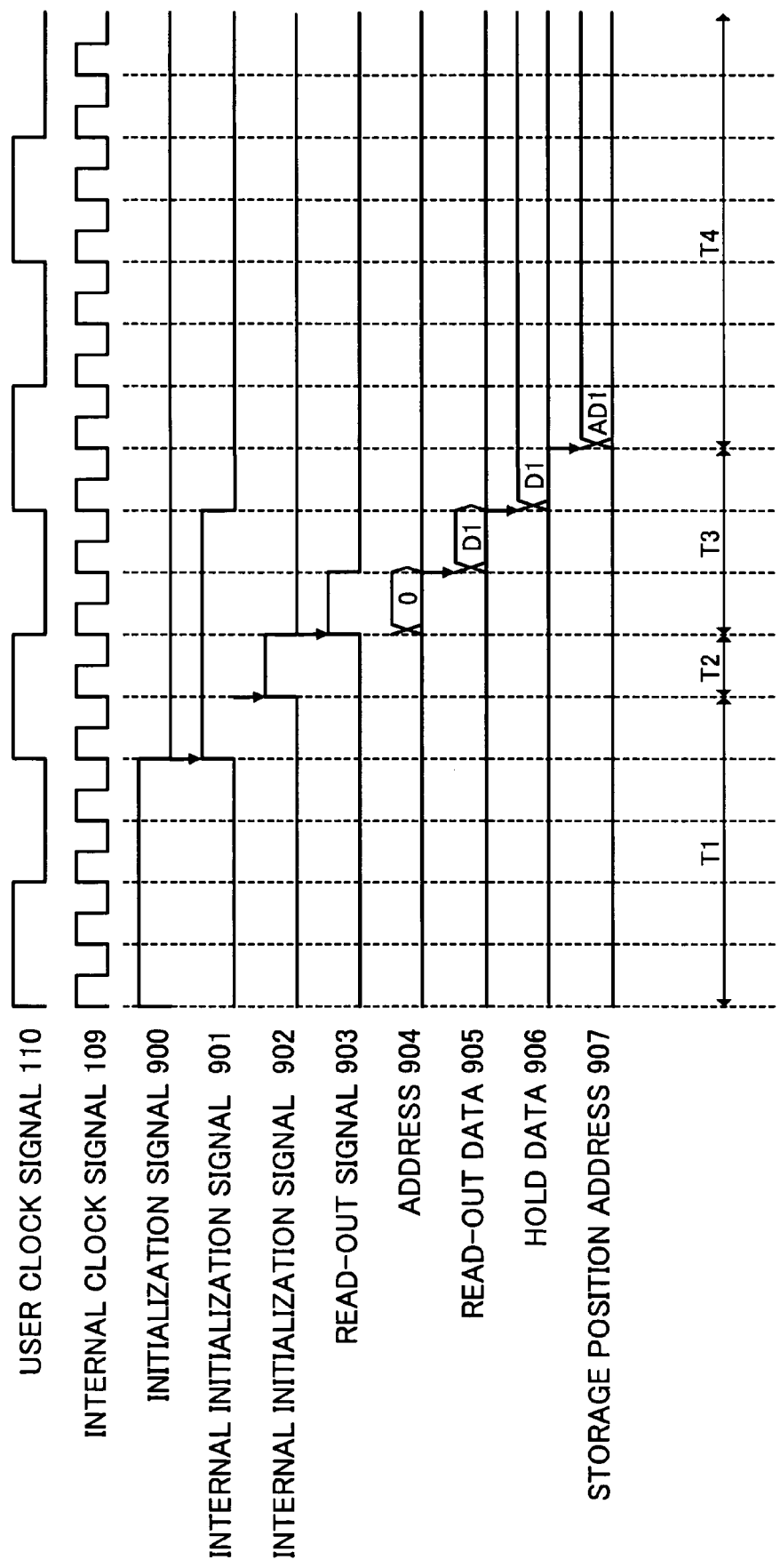
FIG. 9 is a timing diagram illustrating the operation at the time of initialization of a programmable logic circuit of the first embodiment of the present invention.
Figure 10:
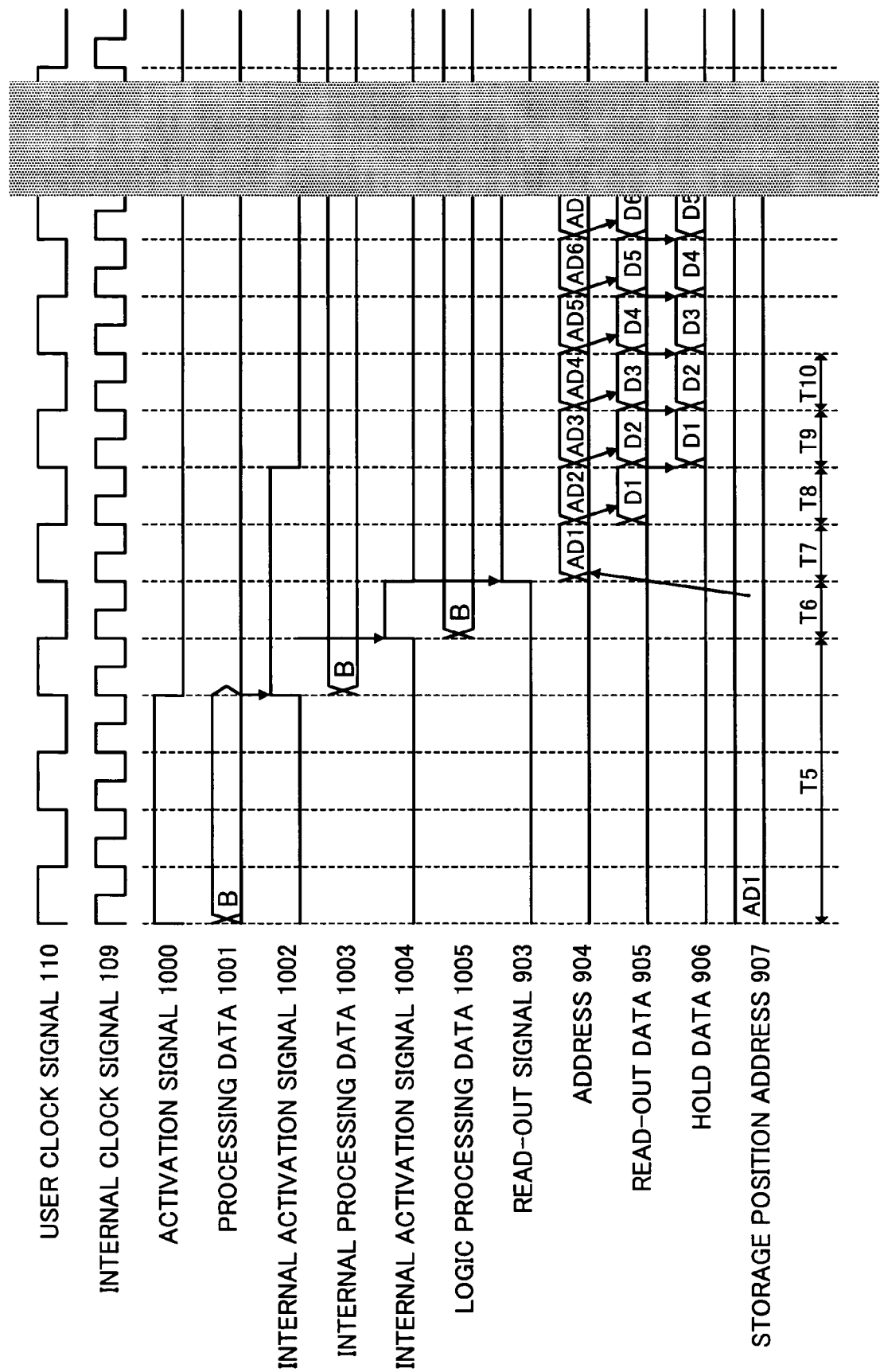
FIG. 10 is a timing diagram illustrating the operation at the time of start-up and the time of data processing of a programmable logic circuit of the first embodiment of the present invention.

Next, a description is given with reference to the drawings of the operation of programmable logic circuit 100. An example of the timing of operations of programmable logic circuit 100 is shown in FIG. 9 and FIG. 10. An initialization operation from outside is shown in FIG. 9. Activation from outside and an actual logic processing operation are shown in FIG. 10.

First, in period T1, input/output control section 103 receives initialization signal 900 synchronized with user clock signal 110 from user circuit 108 and holds this as internal initialization signal 901. In period T2, input/output control section 103 synchronizes the held internal initialization signal 901 with internal clock signal 109 and outputs this to control bus 104. Internal initialization signal 902 of control bus 104 is input to memory control sections 201 of all of the processor elements 101.

In period T3, memory control sections 201 of processor elements 101 output read-out signal 903 for a specific address 904 of memory apparatus 102 taking the input internal initialization signal 902 as a trigger. After this, memory control section 201 holds input read-out data 905 once as hold data 906, and extracts and holds a storage position address 907 of setting information from this hold data 906. Storage position addresses 907 of the setting information are then stored in each processor element 101 as a result of the operations of T1 to T3, and a state where processing can be executed at any time is entered.

In period T4, programmable logic circuit 100 is then in a standby state. In period T5, input/output control section 103 receives activation signal 100 synchronized with user clock signal 110 and data 1001 for processing use from user circuit 108 and holds this as internal activation signal 1002 and processing data 1003. In period T6, input/output control section 103 outputs the held internal activation signal 1002 in synchronization with internal clock signal 109 and outputs this to control bus 104. Further, input/output control section 103 synchronizes the held internal processing data 1003 with internal clock signal 109 and outputs the result data to input bus 105.

Internal activation signal 1004 of control bus 104 is input to memory control sections 201 of all of processor elements 101. Logic processing data 1005 of input bus 105 is input to logic elements 200 of all of processor elements 101.

In period T7, memory control section 201 of each processor element 101 outputs read-out signal 903 for storage position address 907 held in period T3 of memory apparatus 102 taking input internal activation signal 1004 as a trigger. In period TB, each memory control section 201 holds read-out data 905 output from memory apparatus 102 as hold data 906. At the same time, memory control section 201 outputs read-out signal 603 to the next address of memory apparatus 102.

In period T9, each memory control section 201 outputs hold data 906 to logic element 200. Further, each memory control section 201 holds read-out data 905 output from memory apparatus 102. At the same time, each memory control section 201 outputs a read-out signal to the next address of memory apparatus 102. Each logic element 200 carries out arrangement, duplication and inversion processing for logic processing data 1005 from input bus 105 based on input hold data (setting information) 906 and holds the data after processing in internal flip-flop 302.

In period T10, each memory control section 201 outputs hold data 906 to logic element 200. Further, each memory control section 201 internally holds read-out data 905 output from memory apparatus 102. At the same time, each memory control section 201 outputs read-out signal to the next address of memory apparatus 102.

Each logic element 200 then carries out logic processing on logic processing data 1005 from flip-flop 302, input bus 105 and neighboring processor element 101 based on input hold data (setting information) 906 and holds the data after processing in flip-flop 302. In the following, single logic processing is implemented by repeating the processing of period T10.

In all of the periods, data of flip-flop 302 is output to output bus 106, and input/output control section 103 always holds this data in synchronization with internal clock signal 109. Input/output control section 103 outputs the hold data in synchronization with user clock signal 110 and outputs this data to user circuit 108. User circuit 108 refers to a flag of the input data, and holds the output data (data after logic processing) or the data after a predetermined period.

Next, a description is given with reference to the drawings of an example of mapping specific logic processing functions at programmable logic circuit 100. For ease of description, only the operations of logic element 200 at the periods T9 and T10 shown in the operation example will be described.

Figure 12:
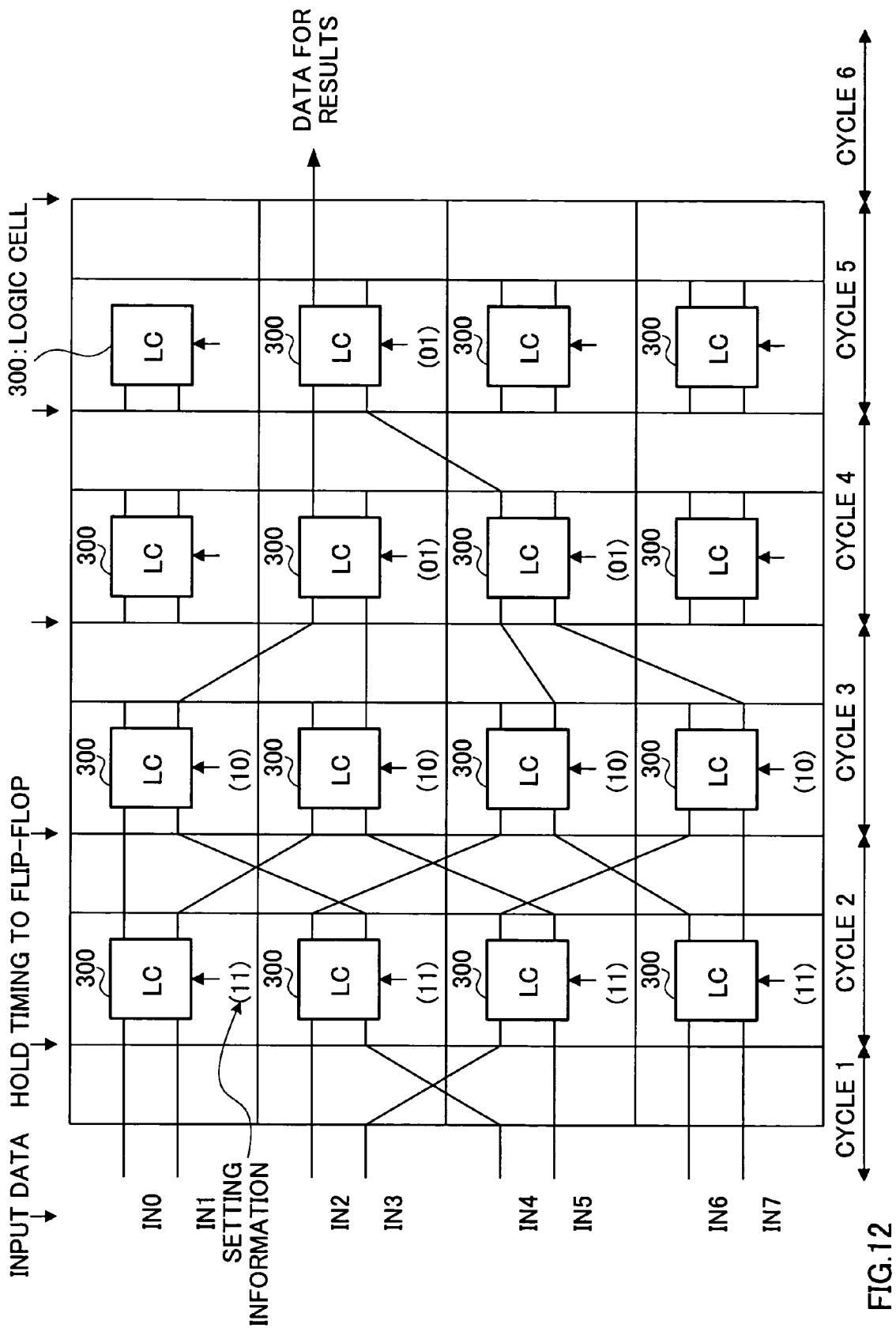
FIG. 12 is a view of the operations of a processor element expanded in a time axis direction in the case where a four-bit comparator circuit is mapped using a programmable logic circuit of the first embodiment of the present invention.

FIG. 11 shows a function of logic cell 300 with two inputs and two outputs. FIG. 12 shows an example of the case where a four-bit comparator circuit is mapped with programmable logic circuit 100 having logic cells 300. In FIG. 12, four processor elements 101 that are physically different are shown in the longitudinal direction, and what kind of processing is carried out by the same processor elements 101 in each cycle is shown in the lateral direction.

Figure 13:
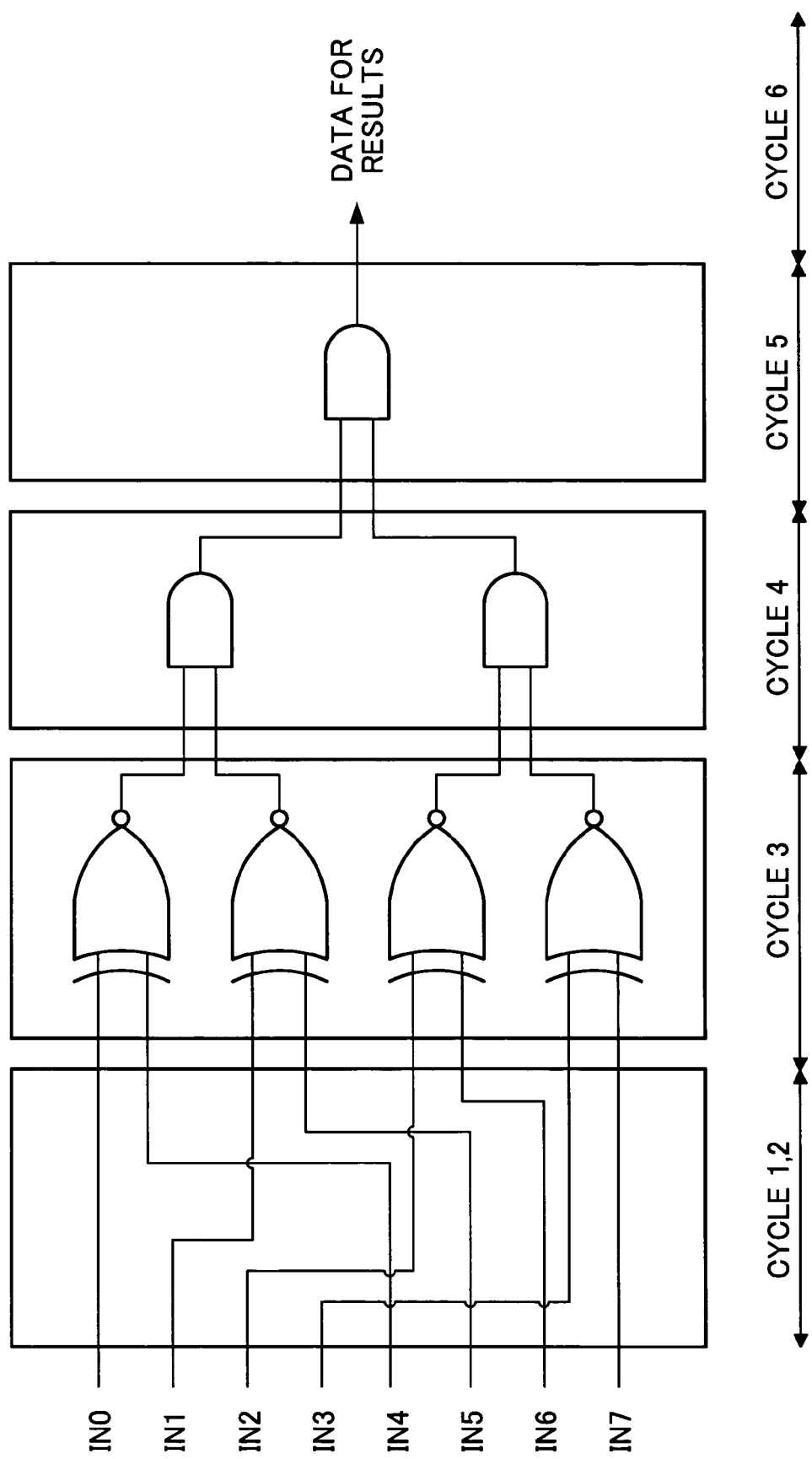
FIG. 13 is a circuit diagram showing a four-bit comparator circuit formed by a processor element in the case where a four-bit comparator circuit is mapped using a programmable logic circuit of the first embodiment of the present invention.

FIG. 13 shows a four-bit comparator circuit. As shown in FIG. 13, eight bits of data of IN0 to 7 are taken as input data, and comparison results for IN0 to 3 and IN4 to 7 are output as one bit of data.

In FIG. 12, input and output of logic cell (LC) 300 is such that the upper side is the LSB and the lower side is the MSB. Further, data described at the lower part of logic cell (LC) 300 is setting information of logic cell (LC) 300. The plurality of logic cells (LC) 300 operate as shown in FIG. 13. First, in cycle 1 and 2, the plurality of logic cells (LC) 300 arrange the input data in bit units. In cycle 3, the plurality of logic cells (LC) 300 carry out XNOR processing on each bit. In cycle 4, the plurality of logic cells (LC) 300 carry out AND processing on the results of cycle 3. In cycle 5, the plurality of logic cells (LC) 300 carry out AND processing on the results of cycle 4. In cycle 6, the plurality of logic cells (LC) 300 output comparison results. As a result, an output is determined in six cycles of internal clock signal 109. When the number of clocks of internal clock signal 109 is six times the number of clocks of user clock signal 110, from user circuit 108, comparison processing seems to be completed in one clock.

Next, a detailed description is given with reference to a drawing of principally the operations of memory control section 201 of programmable logic circuit 100 of the first embodiment of the present invention.

As shown in FIG. 3, memory control section 201 is connected to memory apparatus 102, control bus 104, and data bus 111. Further, input terminal of memory control section 201 is connected to output terminal of flip-flop 302 of logic element 200. Moreover, output terminal of memory control section 201 is connected to logic cell 300 and cross-connecting switch 301 of logic element 200.

Memory control section 201 exchanges information with memory apparatus 102 based on a control signal from control bus 104 and receives data bus data 1111 from data bus 111. Further, memory control section 201 receives flip-flop data 3021 from flip-flop 302.

Next, a detailed description is given of jump control by programmable logic circuit 100.

Figure 14:
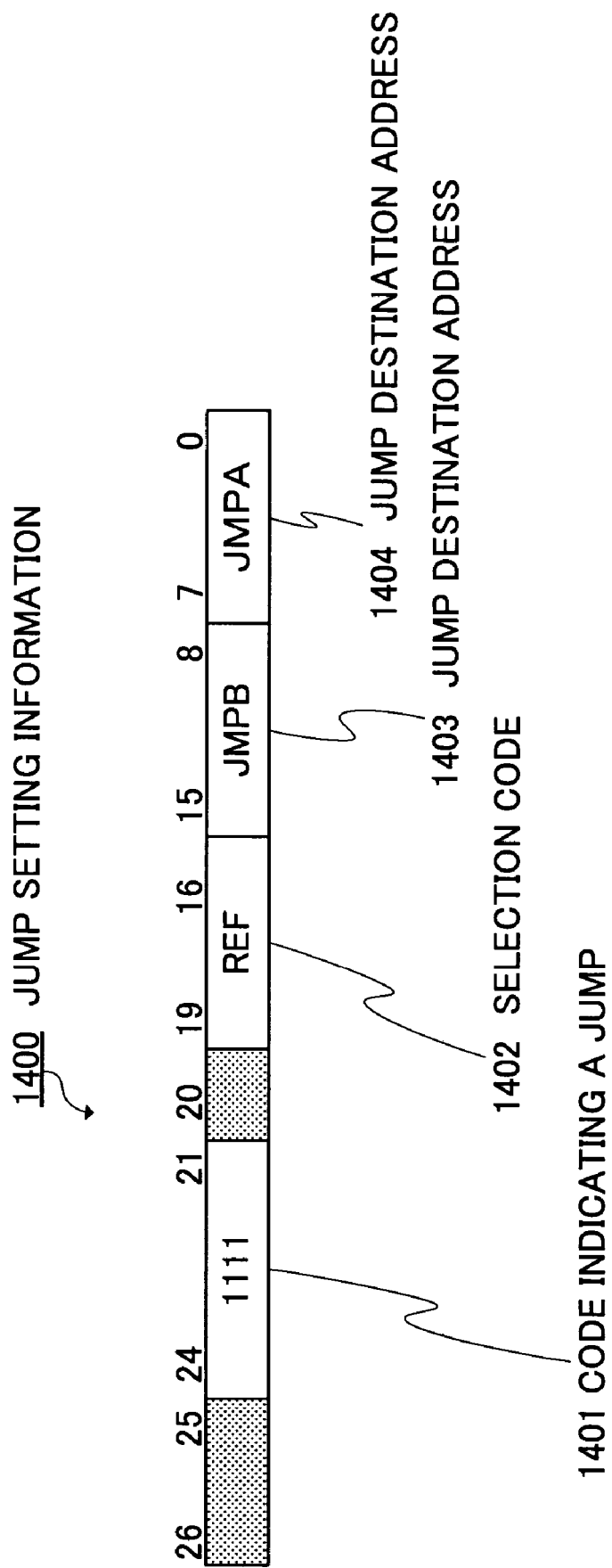
FIG. 14 is a view illustrating setting information for use in jumping used at a programmable logic circuit of the first embodiment of the present invention.

FIG. 14 is a view illustrating a configuration of jump setting information used in jump control by programmable logic circuit 100. Jump setting information 1400 has code 1401 indicating a jump, jump determination data selection code (REF) 1402, jump destination address (JMPB) 1403 and jump destination address (JMPA) 1404.

Code 2101 indicating a jump is comprised of bits 24 to 21, indicating a jump when "1111", and indicating normal processing other than a jump when not "1111." Jump determination data selection code 1402 is comprised of bits 19 to 16, and is information for selecting data used in a jump determination. In this example, jump determination data selection code 1402 can be used as information for selecting one specific bit from data bus data 1111 and flip-flop data 3021. Jump destination address 1403 is comprised of bits 15 to 8, and indicates the jump destination address when the determination bit=1. Jump destination address 1404 is comprised of bits 7 to 0, and indicates a jump destination address in the case of the determination bit=0.

In FIG. 3, in the series of read-out operations from memory apparatus 102, memory control section 201 refers to bits 24 to 21 of the read-out data. When the data value is other than "1111," memory control section 201 determines that the read-out data is normal setting information, transfers the data as is to logic element 200, and continues normal processing. Further, when bits 24 to 21 are "1111," memory control section 201 determines that the read-out data is jump control information, transfers dummy setting information of data of, for example, all "0" for stopping operation temporarily to logic element 200, and then refers to the REF bits in FIG. 14, namely, bits 19 to 16.

Next, memory control section 201 selects one specific bit from data bus data 1111 and flip-flop data 3021 in accordance with the REF bits, and when the selected bit is "1," the address designated by JMPB to the read-out address output to memory apparatus 102 is set.

When the selected bit is "0," memory control section 201 sets the address designated by JMPA to the read-out address output to memory apparatus 102. Thereafter, memory control section 201 reads out setting information from memory apparatus 102 sequentially from the set address, and transfers this information to logic element 200.

Next, a detailed description is given with reference to FIGS. 1 to 3 and FIGS. 15 to 17 of processing performed by jump control of programmable logic circuit 100.

Figure 15:
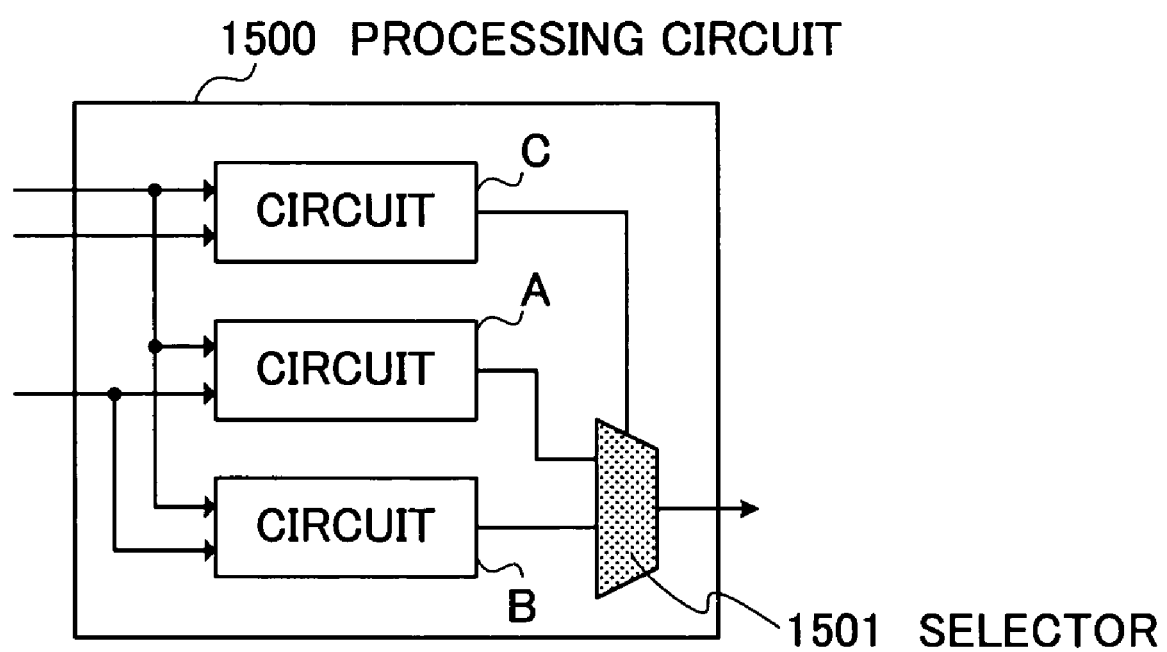
FIG. 15 is a block diagram showing a processing circuit mounted with a programmable logic circuit.

FIG. 15 is a block diagram showing a processing circuit mounted with a programmable logic circuit. In FIG. 15, processing circuit 1500 operates such that selector 1501 outputs a value of one of the processing results of circuit A and circuit B to outside in accordance with the processing results of circuit C. For simplicity, each circuit A, B and C can be implemented using a single processor element. Further, the number of processor elements mounted on processing circuit (LSI) 1500 is taken to be three.

Figure 16:
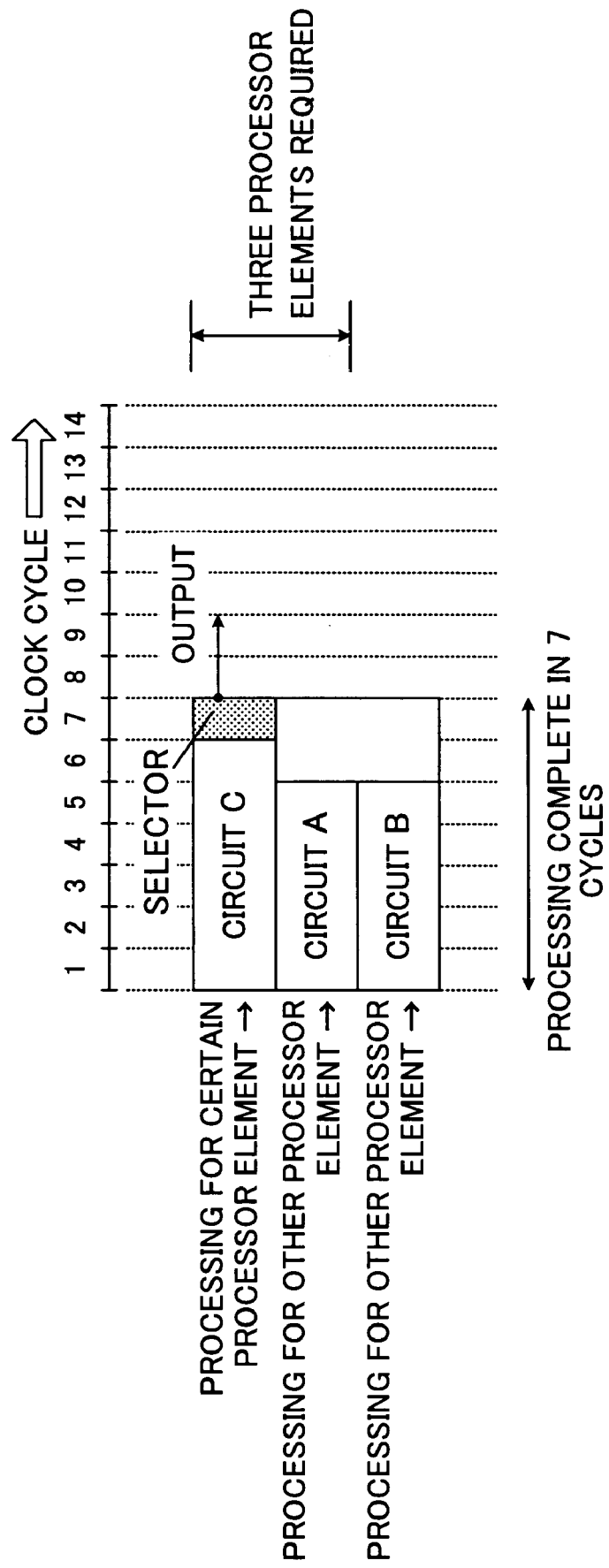
FIG. 16 is a view illustrating a processing cycle in the case where jump control is not used for the programmable logic circuit of the first embodiment of the present invention.

First, a processing cycle in the case where jump control of the programmable logic circuit is not used is shown in FIG. 16. FIG. 16 shows the processing latencies of the circuits with the progress of the clock cycle from left to right. For example, the processing latency of circuit A is five cycles. The processing latency of circuit B and circuit C is five cycles and six cycles respectively. Sequentially to absorb the differences between these latencies, only data holding is carried out during the cycles up to the completion of processing for circuits A, B and C. In cycle 7, one processor element receives the results of circuit A and B, executes the processing of selector 1501 in FIG. 15, and outputs the processing result data of processing circuit 1500 to outside.

As shown in FIG. 16, as a result, seven cycles of processing time and three processor elements are necessary. This means when processing where one processor element uses one cycle is taken to be a unit of processor element time, then 3×7=21 units of processor element time are used.

Figure 17:
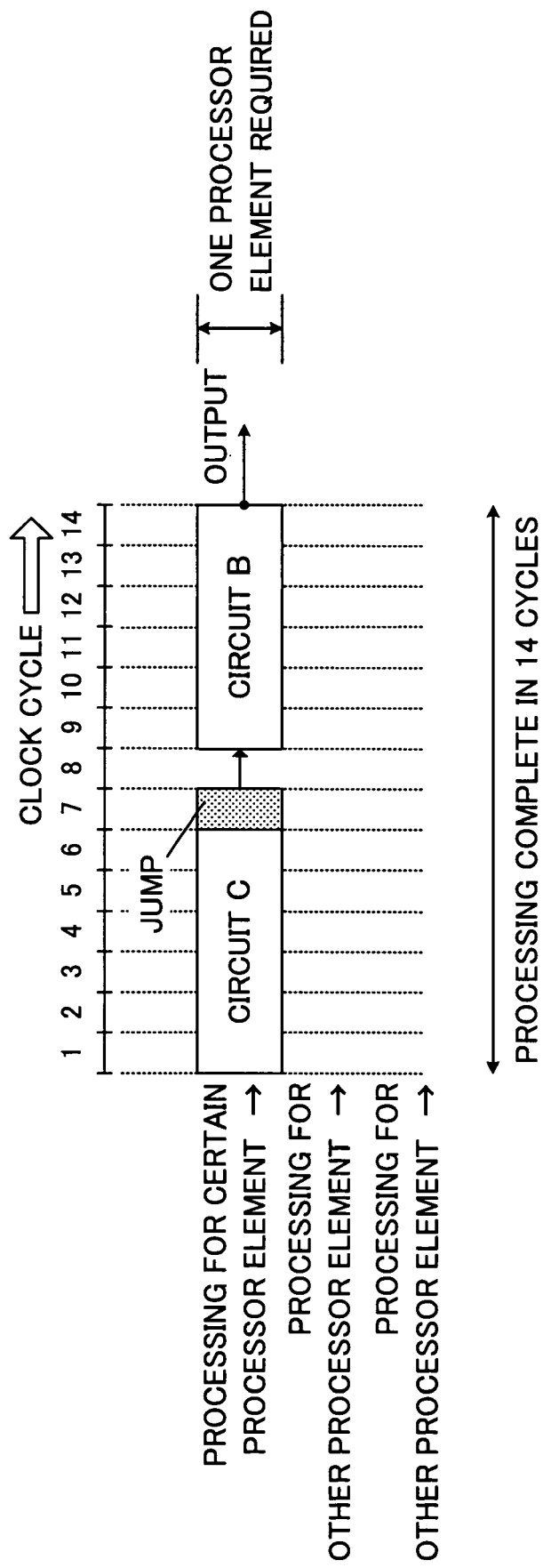
FIG. 17 is a view illustrating a processing cycle in the case where jump control is used for the programmable logic circuit of the first embodiment of the present invention.

On the other hand, a processing cycle in the case where jump control of the programmable logic circuit 100 is used is shown in FIG. 17. In the example shown in FIG. 17, only processing for circuit C is executed in the period up to cycle 6 in FIG. 16, and in cycle 7, jump determination is executed using the result data of circuit C. Memory control section 201 outputs an address corresponding to the processing of circuit B to memory apparatus 100 as the jump determination result and circuit B is executed from the next cycle. As a result, the overall processing time increases to 14 cycles, but the number of processor elements required can be reduced to one. This means that overall processing can be completed using 1×14=14 units of processor element time.

In this way, in the first embodiment of the present invention, it is possible to reduce processing portions that are effectively deemed unnecessary for processing executed simultaneously in parallel by implementing jump control. In particular, by using the jump control in processing where the time required until output is long, it is possible to allocate other processing to processor elements 101 that are in an empty state, and overall processing efficiency can therefore be increased. Further, in the first embodiment of the present invention, it is possible to effectively increase overall processing performance in the case where the number of processor elements is not sufficient for the circuit on which mounting is intended.

Second Embodiment

The following is a detailed description with reference to a drawing of a second embodiment of the present invention. The configuration of the programmable logic circuit of the second embodiment of the present invention is the same as the programmable logic circuit 100 of the first embodiment of the present invention.

The programmable logic circuit of the second embodiment of the present invention improves memory usage efficiency using jump control processing.

Figure 18:
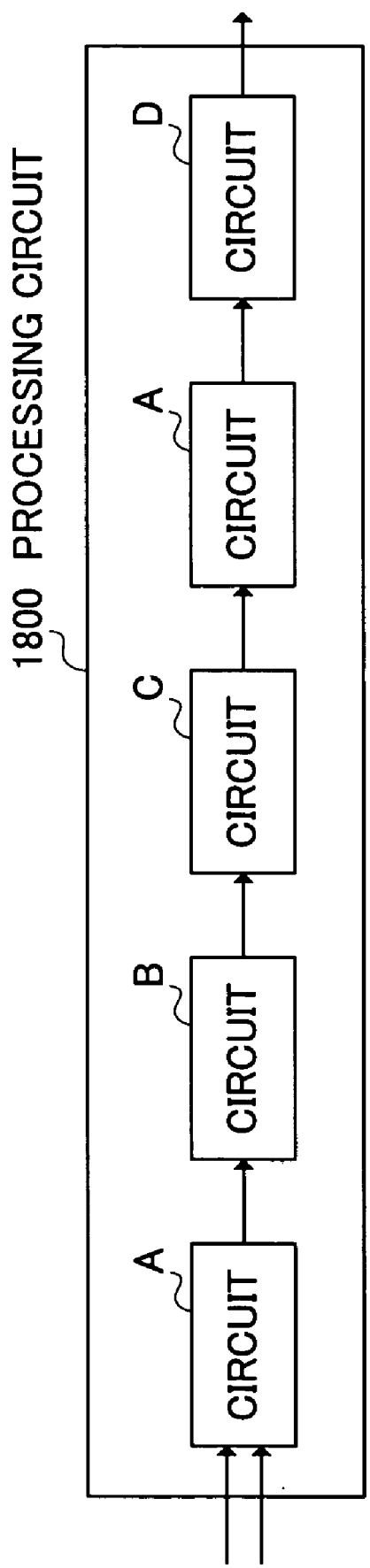
FIG. 18 is a block diagram showing a processing circuit mounted with a programmable logic circuit.

FIG. 18 is a block diagram showing a processing circuit mounted with a programmable logic circuit. In FIG. 18, processing circuit 1800 is a circuit carrying out processing in the order of circuit A, circuit B, circuit C, circuit A and circuit D. The first circuit A and the third circuit A are taken to carry out the same processing with respect to the input.

Figure 19:
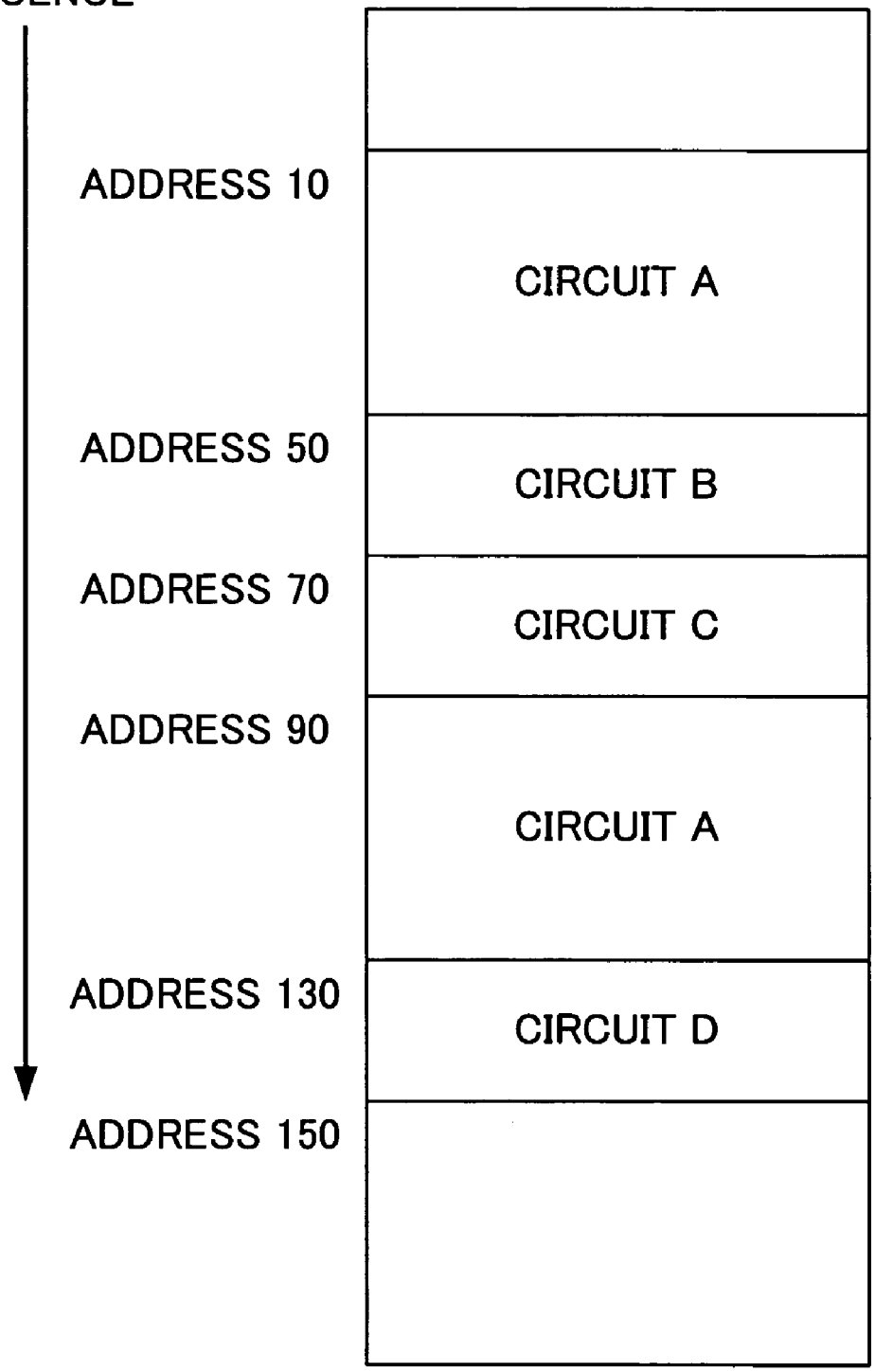
FIG. 19 is a view illustrating a storage state for setting information within a memory apparatus in the case where jump control is not used for a programmable logic circuit of a second embodiment of the present invention.

Further, FIG. 19 is a view illustrating a storage state for setting information within memory apparatus 102 in the case where jump control of programmable logic circuit 100 is not used. In FIG. 19, circuit A uses a 40-word memory region, and circuits B, C and D use 20-word memory regions, respectively.

Processing circuit 1800 in FIG. 18 executes sequentially from address 10 to address 150 of memory apparatus 102, and uses a region of 140 words in total.

Figure 20:
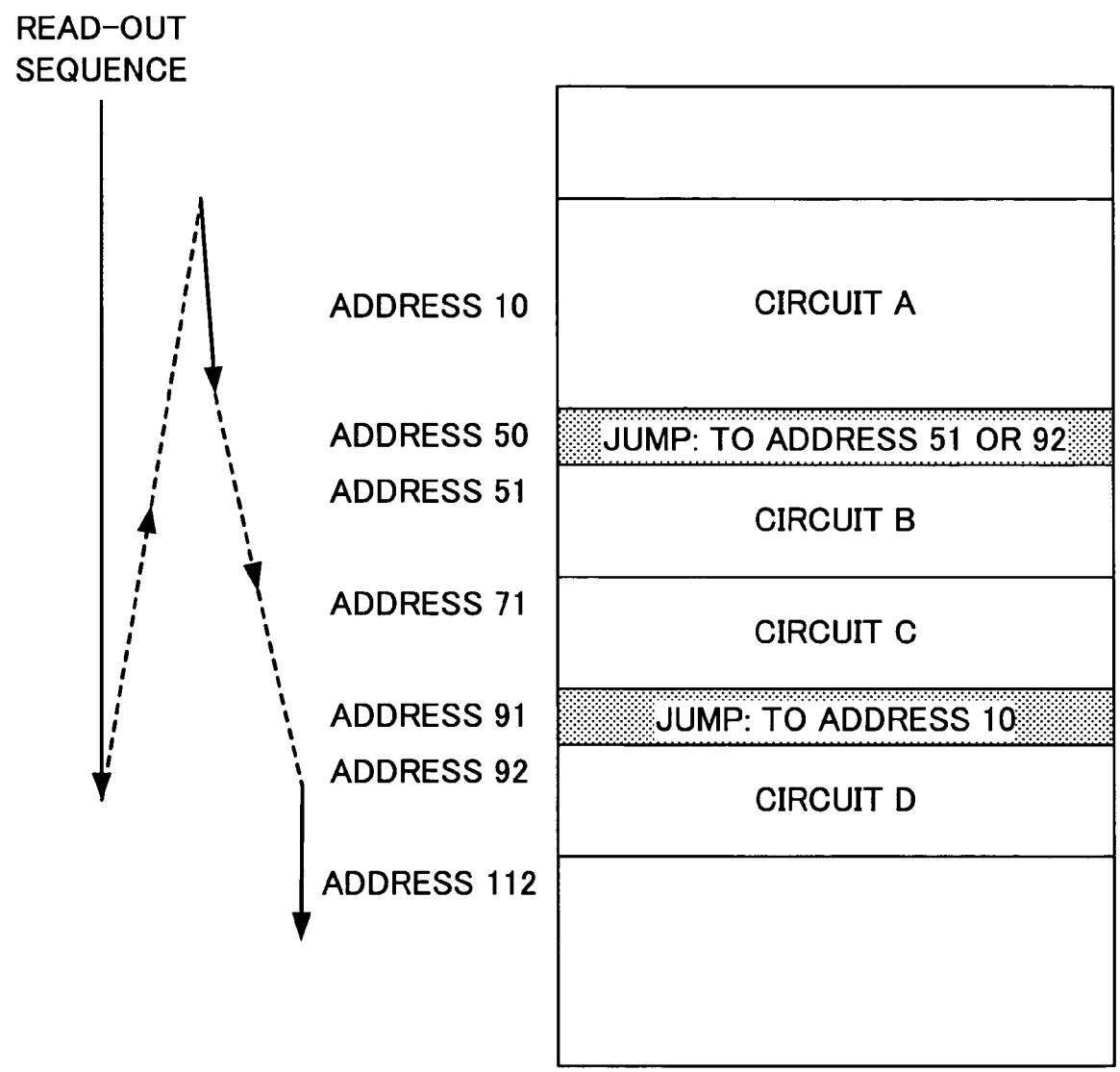
FIG. 20 is a view illustrating a storage state for setting information within a memory apparatus in the case where jump control is used for a programmable logic circuit of the second embodiment of the present invention.

On the other hand, FIG. 20 is a view illustrating a storage state for setting information within memory apparatus 102 in the case where jump control of programmable logic circuit 100 is used. In FIG. 20, jump control information is inserted at a lead address of circuit B or circuit D after the processing of circuit A. Further, jump control information for jumping to a lead address of circuit A or circuit D is inserted after the processing of circuit C. In this example, the processing order starts with performing reading out from address 10, and after processing of circuit A, a jump to address 51 is made, and then processing of circuit B is performed. After this, processing of circuit C is carried out, and after completion of this processing, a jump is made to address 10, and the processing of circuit A is again performed.

After completion of the processing of circuit A, a jump is made to address 92, and processing of circuit D is carried out. This means that effectively a region of one portion of circuit A is eliminated. A method of jump may be a method where a flag bit is generated at the time of completion of processing for circuit C, and this flag bit is then employed.

In the second embodiment of the present invention, it is possible to eliminate memory regions of a circuit used a plurality of times by implementing jump control, and the efficiency of function mounting of the circuit as a whole is increased. Further, in the second embodiment of the present invention, in processing of monitoring input data from outside or processing counting up to a specific value, a circuit where the same processing is repeatedly executed a large number of times—for example, a circuit carrying out specific processing after counting up to 100—can substantially reduce the implementation area by inserting jump control information after a circuit carrying out +1 processing and using the comparison result of a count value and a fixed value 100 as jump determination conditions.

In the second embodiment of the present invention, jump addresses are not necessarily limited to the two addresses, and a large number of jump destination addresses may be set by increasing the number of bits refereed to.

Third Embodiment

The following is a detailed description with reference to a drawing of a third embodiment of the present invention. The configuration of the programmable logic circuit of the third embodiment of the present invention is the same as the programmable logic circuit 100 of the first embodiment of the present invention. The programmable logic circuit of the third embodiment of the present invention improves mounting efficiency using stopping control.

Figure 21:
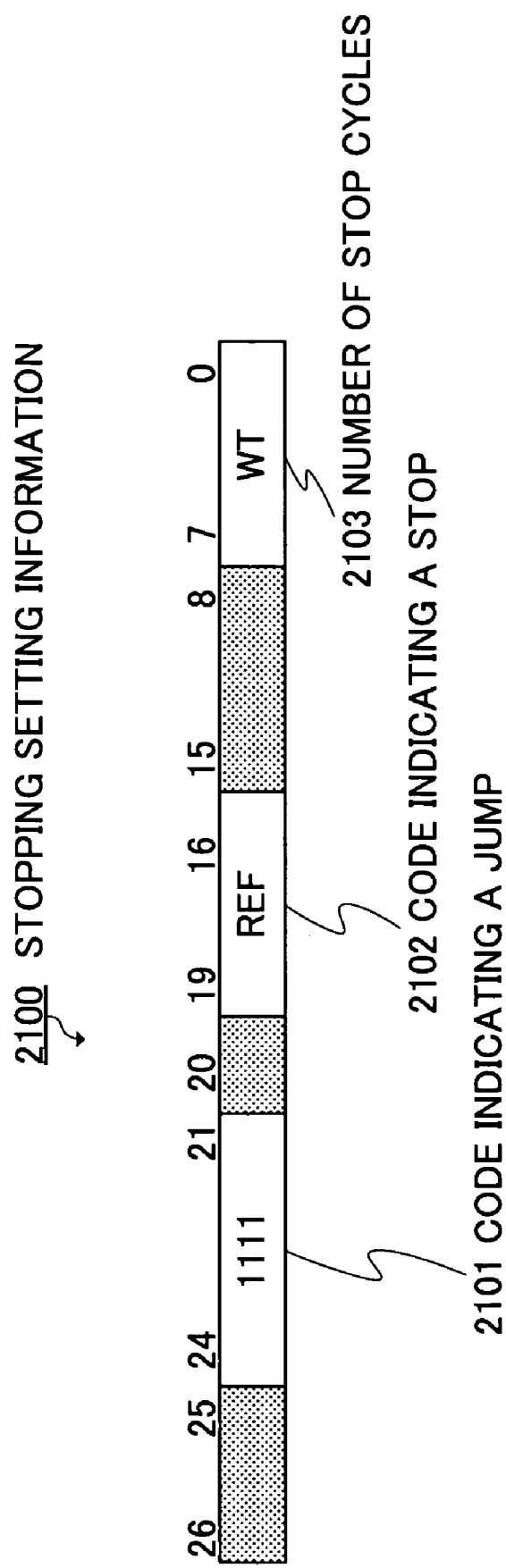
FIG. 21 is a view illustrating stopping setting information used in stopping control at a programmable logic circuit of a third embodiment of the present invention.

FIG. 21 is a view illustrating stopping setting information used in stopping control at a programmable logic circuit 100 of the third embodiment of the present invention. Stopping setting information 2100 has code 2101 indicating a jump, code (REF) 2102 indicating a stop, and stop cycle number 2103.

Code 2101 indicating a jump is comprised of bits 24 to 21, indicating a jump when "1111", and indicating normal processing other than a jump when not "1111." Code 2102 indicating stopping is comprised of bits 19 to 16, and is information indicating whether or not stopping takes place. Stop cycle number 2103 is information of a stop cycle number (stop period) at time code 2101 indicating stopping indicates stop.

In FIG. 3, in the operations for reading out information from memory apparatus 102, memory control section 201 refers to bits 24 to 21 of the read-out information. When the data value is other than "1111," memory control section 201 determines that the read-out information is normal setting information, transfers the information as is to logic element 200, continues normal processing. When bits 24 to 21 of the read-out information are "1111" and REF bits are other than "1111," memory control section 201 determines that the read-out information is a jump code and carries out the aforementioned jump operation.

Further, when bits 24 to 21 of the read-out information are "1111" and the REF bits are "1111," memory control section 201 determines that the read-out information is a stop code, latches bits 0 to 7 internally, and starts counting up on the internal counter. Counting up then continues until the count value reaches the latch data value, while at the same time, dummy setting information of, for example, data of all "0" for stopping operation at logic element 200 continues to be transferred. During this time, memory control section 201 does not read out information of memory apparatus 102. After this, at the time the count value reaches the value of the latch data, memory control section 201 starts to read out information of memory apparatus 102 again and resumes normal operation.

As a result of this control, it is possible to minimize the power consumed by a certain processor element 101 that is in a state awaiting the completion of processing of another processor element 101 operating in unison or of a processor element 101 that is no longer required to operate due to having completed its own processing, and unnecessary regions at the memory apparatus 102 can be eliminated.

For example, in FIG. 15, in the case where processing of circuit A and circuit B is complete in two cycles, and in the case of reading out the dummy stop code up to the completion of processing for circuit C per cycle, the memory region for a 4×2=8 cycle portion is only used for the stop code. It is then possible to eliminate a six-cycle portion of unnecessary code by inserting a stop code directly after the region for circuit A and circuit B. As the memory access for this period is stopped at the same time, it is possible to minimize power consumption by this portion. Further, by setting a value making the stop cycle x infinite in the region of the stop cycle number, it is also possible to minimize power consumption of processor elements 101 that are not used from the start.

As described above, in programmable logic circuit 100 of the first, second and third embodiments of the present invention, the plurality of processor elements 101 are able to operate independently or in unison, and carry out a plurality of types of logic processes at the same time in parallel, or a single logic process in unison.

In programmable logic circuit 100 of the first, second and third embodiments of the present invention, the same elements are arranged in a single row-shape in one dimension so as to provide flexibility according to mounting scale and provide a high degree of expandability. Further, in programmable logic circuit 100 of the first, second and third embodiments of the present invention, by limiting data exchange to between neighboring processor elements 101, it is possible to eliminate setting information substantially, and consequently reduce the implementation area of the circuit, the cost and power consumption of the mounted LSI.

Further, programmable logic circuit 100 of the first, second, and third embodiments of the present invention ensures that the wiring distance from a flip-flop of an arbitrary processor element 101 to the flip-flop of another neighboring processor element 101 is a minimum and fixed regardless of the number of mounted elements, so that it is possible to pull up the operating frequency to a limit and enable a high-speed operation compared to programmable logic of the related art.

Further, in programmable logic circuit 100 of the first, second, and third embodiments of the present invention, processing is carried out while changing repeating functions on the same circuit, so that it is possible to reduce circuit implementation area, and consequently reduce the cost and power consumption of the mounted LSI.

In the first embodiment of the present invention, internal clock signal 109 is not necessary to be a multiple of user clock signal 110, and, for example, a clock signal not synchronized with user clock signal 110 can be used as an internal clock signal by using, for example, an appropriate clock transfer circuit at input/output control section 103.

Further, in the first, second and third embodiments of the present invention, memory apparatus 102 does not have to exist within programmable logic circuit 100, and may have a configuration where memory apparatus 102 exists outside of programmable logic circuit 101. Moreover, in the first, second, and third embodiments of the present invention, clock generating circuit 107 may be disposed within programmable logic circuit 100.

Further, in the first, second and third embodiments of the present invention, it is also possible to insert a select circuit such as a multiplexor between memory apparatus 102 and processor element 101 and change the connection between memory apparatus 102 and each processor element 101 by settings. However, in this case, since the amount of delay of data processing is increased, it is necessary to increase speed using a pipeline or the like sequentially to maintain a frequency.

Further, in the first, second, and third embodiments of the present invention, the connections among each block within logic element 200 shown in FIG. 3, logic cell 300, cross-connecting switch 301 and flip-flops 302, and the connections among each block and input bus 105, output bus 106 and neighboring logic element 200 are by no means limited to that of FIG. 3, and, for example, flip-flops may be provided between logic cells 300 and cross-connecting switch 301 so as to further increase operating frequency. Moreover, in the first embodiment of the present invention, data from input bus 105 may be input to logic cell 300 or flip-flop 302 rather than cross-connecting switch 301.

Further, in the first embodiment of the present invention, each of the plurality of processor elements 101 does not have to be connected to other processor elements 101.

Fourth Embodiment

The following is a detailed description with reference to a drawing of a fourth embodiment of the present invention.

Figure 22:
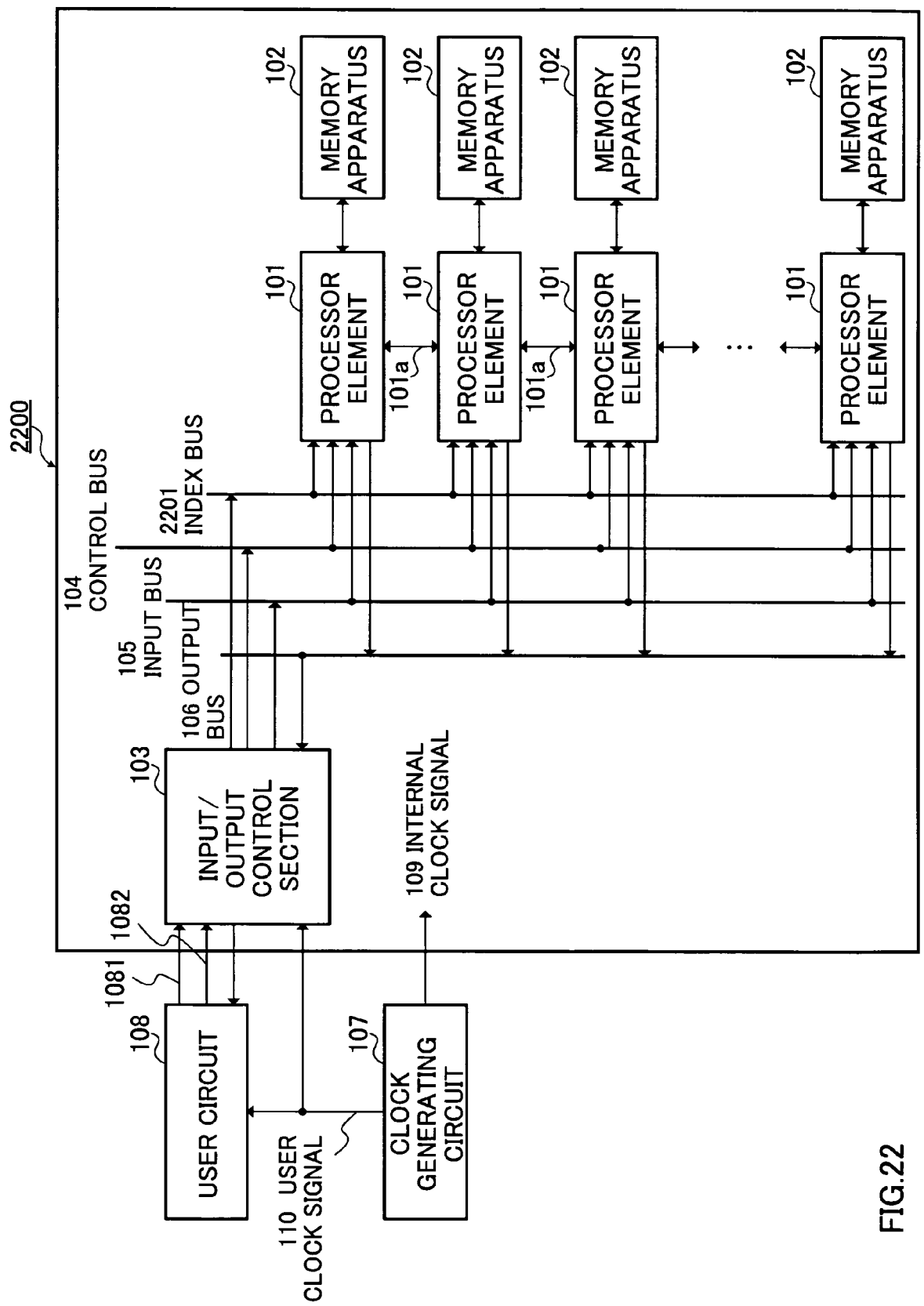
FIG. 22 is a block diagram showing a configuration of a programmable logic circuit of a fourth embodiment of the present invention.

FIG. 22 is a block diagram showing a configuration of a programmable logic circuit of the present invention. In the fourth embodiment of the present invention, elements of the configuration that are the same as for the first embodiment of the present invention are given the same reference numerals and are not described.

As shown in FIG. 22, programmable logic circuit 2200 of the fourth embodiment of the present invention provides a plurality of processor elements 101, a plurality of memory apparatuses 102, input/output control section 103, control bus 104, input bus 105, and output bus 106. Clock generating circuit 107 and user circuit 108 are connected to programmable logic circuit 2200.

The plurality of processor elements 101 and the plurality of memory apparatuses 102 are connected so as to be individually paired together. Processor element 101 and memory apparatus 102 connected so as to be individually paired together constitute a unit logic circuit. A plurality of unit logic circuits are connected together in parallel.

Each of the plurality of processor elements 101 are arranged in a single row-shape in one dimension, and connected to two other neighboring unit logic circuits 101 that are neighboring in physical arrangement by connecting wire 101a. Namely, the plurality of unit logic circuits are arranged in a single row-shape in one dimension, and one unit logic circuit and another unit logic circuit neighboring the one logic circuit in physical arrangement in the plurality of unit logic circuits are connected by connecting wire 101a.

The processor element 101 then exchanges data with another neighboring processor elements 101 using the connecting wire.

Input/output control section 103 is a circuit for interfacing with outside and is connected to user circuit 108. Input/output control section 103 receives input signal 1081 and index designation signal 1082 from user circuit 108. Control bus 104 is connected to input/output control section 103 and processor elements 101. Control bus 104 receives control signals, for example, for initialization and activation from input/output control section 103 and transfers these signals to each processor element 101. Input bus 105 is connected to input/output control section 103 and processor elements

101. Input bus 105 receives data used in logic operations from input/output control section 103 and transfers this data to each processor element 101.

Output bus 106 connects input/output control section 103 and processor elements 101. Output bus 106 receives data for operation results from processor elements 101 and transfers this data to input/output control section 103. Clock generating circuit 107 generates internal clock signal 109 and user clock signal 110. User clock signal 110 is used in user circuit 108 and input/output control section 103. Internal clock signal 109 is a frequency that is a multiple of user clock signal 110 and is used within programmable logic circuit 2200. Index bus 2201 is connected to input/output control section 103 and processor elements 101.

Next, a description is given with reference to the drawings with regards to functions of this programmable logic circuit 2200.

In FIG. 22, content of logic operation carried out by programmable logic circuit 2200 is held as setting information in memory apparatus 102. Each processor element 101 reads out setting information from memory apparatus 102 sequentially and carries out corresponding logic operation. Programmable logic circuit 2200 receives data used for an activation signal and logic operations in synchronization with user clock signal 110 from user circuit 108. After a subsequent fixed period of time elapses, programmable logic circuit 2200 provides the data after logical operation processing to user circuit 108 in synchronization with user clock signal 110.

Next, a description is given with reference to a drawing with regards to the functions of the internal clock of programmable logic circuit 2200.

In FIG. 22, setting information of neighboring processor elements 101 is stored in each memory apparatus 102. When the control signal and memory address are input from processor elements 101, memory apparatus 102 provides setting information designated by the address to processor elements 101. Processor element 101 then determines the content of processing to be executed based on this setting information.

When an initialization signal is input by control bus 104, processor element 101 reads out a specific address of memory apparatus 102, and extracts and holds a storage position address of setting information from the input read-out data. This storage position address is an address indicating the lead position of the setting information.

Further, when an activation signal is input by control bus 104, processor elements 101 sequentially reads out the storage position address in memory apparatus 102. Further, processor element 101 receives data for logic processing use from input bus 105 and neighboring processor elements 101, and after carrying out logic processing on data based on setting information, performs arrangement, duplication, and inversion processing on the data and holds the data after processing. Further, processor elements 101 output the data held after processing to output bus 106 and neighboring processor elements 101.

In this way, the plurality of processor elements 101 then hand over the data. Input/output control section 103 receives the activation signal synchronized with user clock signal 110 from user circuit 108 and data for logic processing use, and provides this data to input bus 105 in synchronization with internal clock signal 109. Further, input/output control section 103 receives the initialization signal synchronized with user clock signal 110 from user circuit 108 and outputs this data to input bus 105 in synchronization with internal clock signal 109. Further, input/output control section 103 receives data after logic processing in synchronization with internal clock signal 109 from output bus 106 and outputs this data to user circuit 108 in synchronization with user clock signal 110. In this way, input/output control section 103 hands over a control signal and data for logic processing use and for processing results to user circuit 108.

Next, a description is given with reference to a drawing of a configuration of the processor elements 101 within programmable logic circuit 2200.

Figure 23:
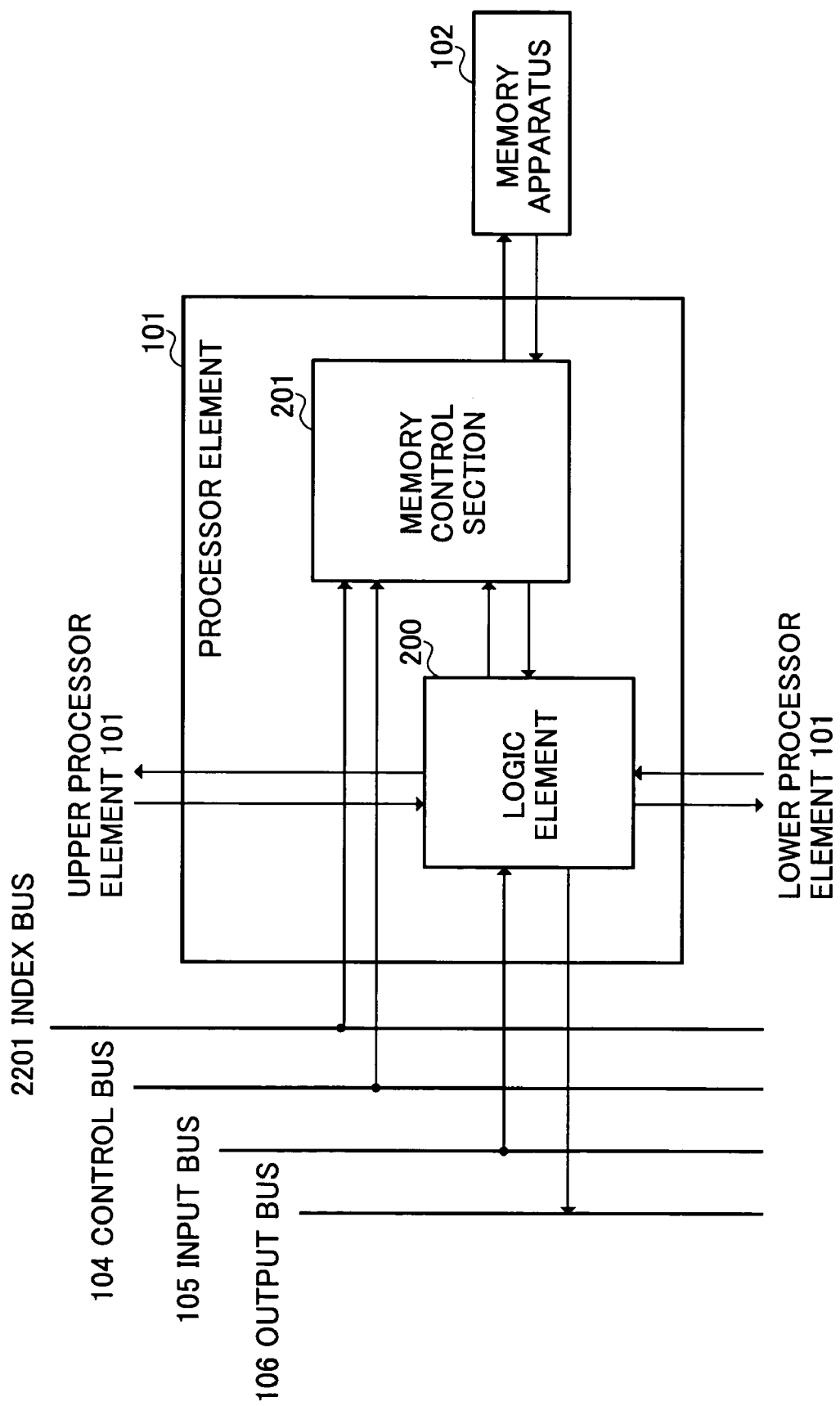
FIG. 23 is a block diagram showing a configuration of a processor element of a programmable logic circuit of the fourth embodiment of the present invention.

FIG. 23 shows a configuration of processor elements 101. As shown in FIG. 23, processor element 101 provides logic element 200 and memory control section 201. Processor element 101 is connected to memory apparatus 102, control bus 104, input bus 105 and output bus 106. Memory control section 201 is connected to memory apparatus 102, logic element 200 and control bus 104. Logic element 200 is connected to logic element 200 and memory control section 201, input bus 105 and output bus 106 of the neighboring processor elements 101.

Next, a description is given with reference to a drawing of the functions of processor elements 101. In FIG. 23, upon receiving the initialization signal from control bus 104, memory control section 201 carries out processing to extract and hold the storage position address described previously. When an activation signal is input from control bus 104, memory control section 201 reads out setting information sequentially from the storage position address held in memory apparatus 102, and temporarily stores, then transfers this setting information to logic element 200.

Logic element 200 receives data from input bus 105 and neighboring processor elements 101, and after carrying out logic processing on data based on setting information transferred from memory control section 201, performs arrangement, duplication, and inversion processing on the data, and holds the data after processing. Moreover, logic element 200 outputs data after processing to output bus 106 and neighboring processor elements 101 based on setting information transferred from memory control section 201.

Next, a description is given with reference to a drawing of a structure for logic elements 200 within processor elements 101 and a configuration of setting information.

Figure 24:
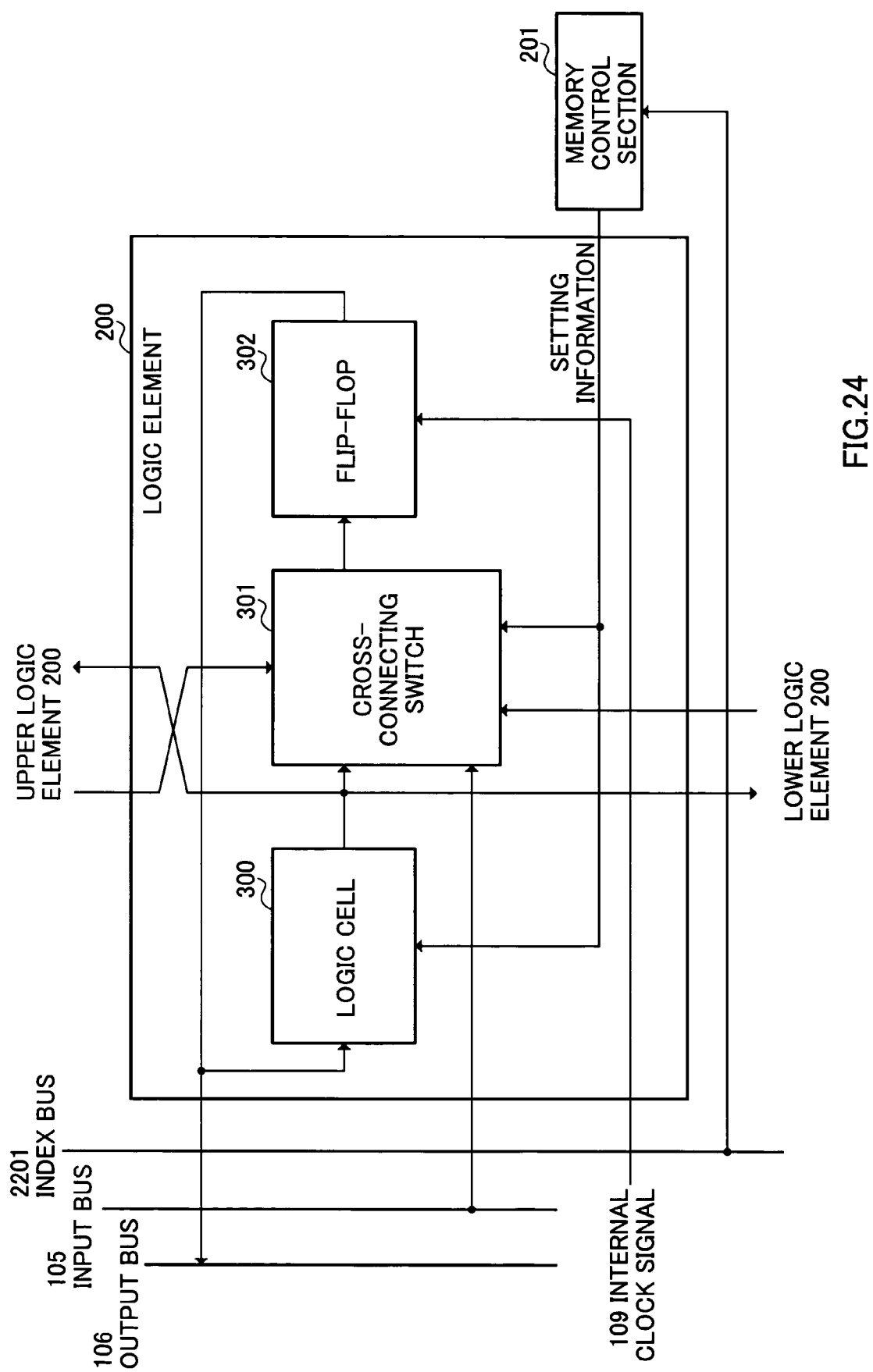
FIG. 24 is a block diagram showing a configuration of a logic element of a processor element for a programmable logic circuit of the fourth embodiment of the present invention.

A configuration of logic element 200 is shown in FIG. 24. A configuration of setting information and memory apparatus 102 are shown in FIG. 25.

In FIG. 24, logic element 200 has logic cell (logic operation circuit) 300, cross-connecting switch (data processing apparatus) 301 and flip-flop 302. Logic element 200 is connected to memory control section 201, input bus 105, and output bus 106. Logic cell 300 is connected to memory control section 201, flip-flop 302, and cross-connecting switch 301. Cross-connecting switch 301 is connected to memory control section 201, logic cell 300, flip-flop 302, input bus 105 and logic cell 300 within neighboring logic element 200. Flip-flop 302 is connected to logic cell 300, cross-connecting switch 301 and output bus 106.

Logic cell 300 constitutes a logic operation circuit. Further, cross-connecting switch 301 constitutes data processing apparatus. Further, cross-connecting switch 301 and flip-flop 302 constitute data processing apparatus.

Figure 25:
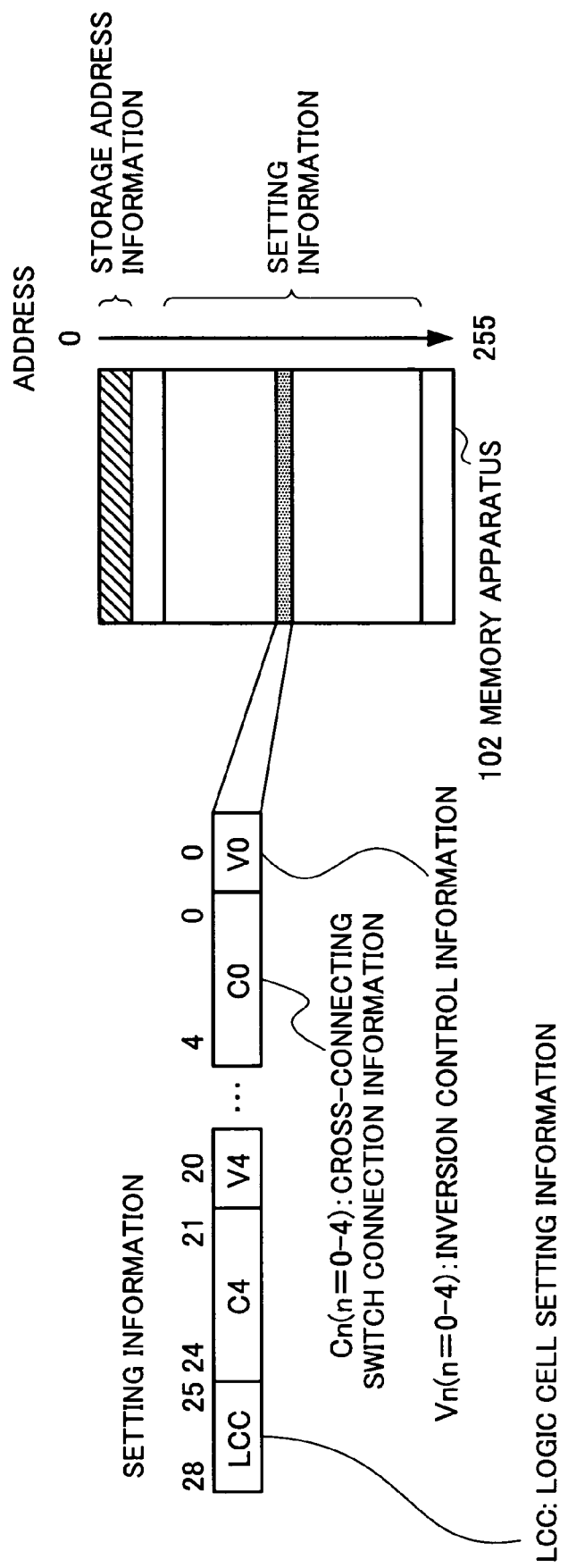
FIG. 25 is a view illustrating a configuration of a memory apparatus of a programmable logic circuit of the fourth embodiment of the present invention.

FIG. 25 shows a configuration of memory apparatus. In FIG. 25, storage address information for setting information is stored at a leading portion within memory apparatus 102. Setting information is stored in specific regions other than the leading portion within memory apparatus 102.

In FIG. 25, bits 25 to 28 are connection information of logic cell 300, and bits 0 to 24 are setting information of cross-connecting switch 301. Bits 0 to 24 are in five units, each unit having a configuration including four bits of connection information and one bit of inversion control information corresponding to the five outputs of cross-connecting switch 301.

Next, a description is given with reference to a drawing of the functions of logic element 200. In FIG. 24, logic cell 300 carries out specific logic processing designated by the setting information transferred from memory control section 201 on data input from flip-flop 302, and outputs data after processing to cross-connecting switch 301 and logic element 200 of neighboring processor element 101. Cross-connecting switch 301 then carries out arrangement, duplication, and inversion processing on specific data designated by setting information transferred by memory control section 201 on data input from logic cell 300, input bus 105, and logic element 200 of neighboring processor element 101, and outputs data after processing to flip-flop 302. Flip-flop 302 holds data input by cross-connecting switch 301 at the timing of internal clock signal 109. Flip-flop 302 outputs held data to logic cell 300 and output bus 106.

The functions and operations of logic cells 300 and cross-connecting switches 301 of the fourth embodiment of the present invention are the same as for the first embodiment of the present invention. The function and operation of programmable logic circuit 2200 of the fourth embodiment of the present invention are the same as for the first embodiment of the present invention with the exception of the absence of the functions and operations of processing of index designation signal 1082 and data bus 111.

Next, a description is given with reference to a drawing of the operation at the time when input/output control section 103 receives index designation signal 1082 from user circuit 108.

As shown in FIG. 22, a user can generate an index designation signal in user circuit 108 for designating a desired item of the first and second setting information with priority by operating user circuit 108. User circuit 108 provides index designation signal 1082 to input/output control section 103.

As shown in FIG. 23 and FIG. 24, input/output control section 103 generates index information according to index designation signal 1082 at the time of receiving index designation signal 1082, and provides this to memory control section 201 in processor element 101 via index bus 2201.

Memory control section 201 then reads out a specific address of memory apparatus 102 based on index information when receiving the index information, and extracts and stores the lead position address indicating the lead position of the storage position address of the setting information.

Upon receiving data and a control signal from input/output control section 103, as described above, based on the destination position address shown at the leading position of the storage position address of the setting information stored in memory control section 201, logic element 200 sequentially changes some or all of the functions of logic cells 300 and cross-connecting switch 301 according to one of the items of setting information read out in sequence from memory apparatus 102 and carries out predetermined operations of a sequential circuit.

In this way, programmable logic circuit 2200 is an integrated body of processor elements 101 carrying out unit operation, and each processor element 101 carries out operations in unison principally with neighboring processing elements 101. Further, it is also possible for the plurality of neighboring processor elements 101 to form a single group so as to carry out one logical process.

As described above, in programmable logic circuit 2200 of the fourth embodiment of the present invention, the plurality of processor elements 101 is able to operate independently or in unison, and carry out a plurality of types of logic processes at the same time in parallel, or a single logic process in unison.

In programmable logic circuit 2200 of the fourth embodiment of the present invention, the same elements are arranged in a single row-shape in one dimension so as to provide flexibility according to mounting scale and provide a high degree of expandability. Further, in the programmable logic circuit 2200 of the fourth embodiment of the present invention, by limiting data exchange to between neighboring processor elements 101, it is possible to eliminate setting information substantially, and consequently reduce the implementation area of the circuit and the cost and power consumption of the mounted LSI.

Further, in programmable logic circuit 2200 of the fourth embodiment of the present invention, the wiring distance from a flip-flop of an arbitrary processor element 101 to the flip-flop of another neighboring processor element 101 is a minimum and fixed regardless of the number of mounted elements, so that it is possible to pull up the operating frequency to a limit, and have a high-frequency compared to programmable logic of the related art.

Further, in programmable logic circuit 2200 of the fourth embodiment of the present invention, processing is carried out while changing repeating functions on the same circuit, so that it is possible to reduce circuit implementation area, and consequently reduce the cost and power consumption of the mounted LSI.

In the fourth embodiment of the present invention, it is not essential for internal clock signal 109 to be a multiple of user clock signal 110, so that, for example, a clock signal not synchronized with user clock signal 110 may be used as an internal clock signal by using, for example, an appropriate clock circuit at input/output control section 103.

Further, in the fourth embodiment of the present invention, memory apparatus 102 does not have to exist within programmable logic circuit 2200, and may have a configuration where memory apparatus 102 exists outside of programmable logic circuit 2200. Further, in the fourth embodiment of the present invention, clock generating circuit 107 may be disposed within programmable logic circuit 2200.

Further, in the fourth embodiment of the present invention, it is also possible to insert a select circuit such as a multiplexor between memory apparatus 102 and processor element 101, and change the connection between memory apparatus 102 and each processor element 101 by settings. However, in this case, as the amount of delay of data processing is increased, it is necessary to increase speed using a pipeline or the like sequentially to maintain a frequency.

Further, in the fourth embodiment of the present invention, the connections between each block within logic element 200 shown in FIG. 24, logic cell 300, cross-connecting switch 301 and flip-flops 302, and the connections between each block and input bus 105, output bus 106 and neighboring logic element 200 are by no means limited to that of FIG. 3, and, for example, flip-flops may be provided between logic cells 300 and cross-connecting switch 301 so as to further increase operating frequency. Further, in the fourth embodiment of the present invention, data from input bus 105 may also be input to logic cell 300 or flip-flop 302 rather than cross-connecting switch 301.

Moreover, in the fourth embodiment of the present invention, each of the plurality of processor elements 101 does not have to be connected to other processor elements 101.

A first aspect of the present invention adopts a configuration having a plurality of unit logic circuits connected in parallel; an input signal control section that supplies input signals received from outside to the plurality of unit logic circuits; and an output signal control section that supplies output signals of the plurality of unit logic circuits to outside, each of the plurality of unit logic circuits comprising: a logic operation section that performs predetermined logic operation on the input signals and generates data, the logic operation section having functions that are changeable based on first setting information; a data processing section that generates data by carrying out arrangement, duplication and inversion processing on the data from the logic operation section based on second setting information, and provides the data to the output signal control section as output signals; a storage section that stores the first and second setting information; and a memory control section that takes control by receiving jump setting information, reading out either the first or the second setting information of the storage section based on the jump setting information and providing the setting information to the logic operation circuit and the data processing section, where each of the plurality of unit logic circuits sequentially changes some or all of the functions of the logic operation section and the data processing section based on the first and second setting information read out sequentially from the storage section and carries out predetermined operations of a sequential circuit.

According to this configuration, each of the plurality of unit logic circuits sequentially change some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits. In addition, according to this configuration, each of the plurality of unit logic circuits controls in such a manner as to receive jump setting information, read out one of the first and second setting information of the storage section based on the jump setting information, and provide the setting information to the logic operation circuit and the data processing section, so that it is possible to provide a more versatile programmable logic circuit.

A second aspect of the present invention adopts a configuration having a plurality of unit logic circuits connected in parallel; an input signal control section that supplies input signals received from outside to the plurality of unit logic circuits; and an output signal control section that supplies output signals of the plurality of unit logic circuits to outside, each of the plurality of unit logic circuits comprising: a logic operation section that performs predetermined logic operation on the input signal and generates data, said logic operation section having functions that are changeable based on first setting information; a data processing section that generates data by carrying out arrangement, duplication and inversion processing on the data from the logic operation section based on the second setting information, and provides the data to the output signal control section as output signals; a storage section that stores the first and second setting information; and a memory control section that receives stopping setting information and controls stopping between the logic operation section and the data processing section based on the stopping setting information, where each of the plurality of unit logic circuits sequentially changes some or all of the functions of the logic operation section and the data processing section based on the first and second setting information read out sequentially from the storage section and carries out predetermined operations of a sequential circuit.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits. According to this configuration, upon receiving stopping setting information, stopping between the logic operation section and the data processing section is controlled based on the stopping setting information, so that it is possible to provide a more versatile programmable logic circuit.

A third aspect of the present invention adopts a configuration where, in the first aspect of the present invention, the logic operation section further comprises a logic cell that performs predetermined logic operation on the input signals and generates data, said logic cell having functions that are changeable based on the first setting information.

According to this configuration, the same effects of the invention as for the first aspect of the present invention are possible.

A fourth aspect of the present invention adopts a configuration where, in the first aspect of the present invention, the data processing section further comprises a cross-connecting switch that generates the data by carrying out arrangement, duplication and inversion processing on the data from the logic operation section based on the second setting information.

According to this configuration, the same effects as for the first aspect of the present invention are possible.

A fifth aspect of the present invention adopts a configuration where, in the fourth aspect of the present invention, the data processing section comprises a flip-flop that holds the data from the cross-connecting switch and supplies the data to the output signal control section as the output signals.

According to this configuration, the same effects as for the fourth aspect of the present invention are possible.

A sixth aspect of the present invention adopts a configuration having a plurality of unit logic circuits connected in parallel; an input signal control section that supplies input signals received from outside to the plurality of unit logic circuits; a connecting section that connects one unit logic circuit in the plurality of unit logic circuits and another unit logic circuit neighboring the one unit logic circuit in physical arrangement; and an output signal control section that supplies output signals of the plurality of unit logic circuits to outside, each of the plurality of unit logic circuits comprising: a logic operation section performs predetermined logic operation on one of the input signal and data from the another neighboring unit logic circuit and generates data, the logic operation section having functions that are changeable based on the first setting information; a data processing section that generates data by carrying out arrangement, duplication and inversion processing on the data from the logic operation section based on the second setting information and provides the data to the output signal control section as the output signals; a storage section that stores the first and second setting information; and a memory control section that takes control by receiving jump setting information, reading out one of the first and second setting information of the storage section based on the jump setting information and providing the setting information to the logic operation circuit and the data processing section, where each of the plurality of unit logic circuits sequentially changes some or all of the functions of the logic operation section and the data processing section based on the first and second setting information read out sequentially from the storage section and carries out predetermined operations of a sequential circuit.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits. In addition, according to this configuration, data is generated by performing predetermined logic operation on one of an input signal and data from another neighboring unit logic circuit, and each of the plurality of unit logic circuits controls in such manner as to receive jump setting information, read out one of the first and second setting information of the storage section based on the jump setting information, and provide this information to the logic operation section and data processing section, so that it is possible to provide a more versatile programmable logic circuit.

A seventh aspect of the present invention adopts a configuration having a plurality of unit logic circuits connected in parallel; an input signal control section that supplies input signals received from outside to the plurality of unit logic circuits; a connecting section that connects one unit logic circuit and another unit logic circuit neighboring the one unit logic circuit in physical arrangement in the plurality of unit logic circuits; and an output signal control section that supplies output signals of the plurality of unit logic circuits to outside, each of the plurality of unit logic circuits comprising: a logic operation section that performs predetermined logic operation on one of the input signal and data from the another neighboring unit logic circuit and generates data, the logic operation section having functions that are changeable based on the first setting information; a data processing section that generates data by carrying out arrangement, duplication and inversion processing on the data from the logic operation section based on the second setting information, and provides the data to the output signal control section as the output signals; a storage section that stores the first and second setting information; and a memory control section that receives stopping setting information and controls stopping between the logic operation section and the data processing section based on the stopping setting information, where each of the plurality of unit logic circuits sequentially changes some or all of the functions of the logic operation section and the data processing section based on the first and second setting information read out sequentially from the storage section and carries out predetermined operations of a sequential circuit.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits. In addition, according to this configuration, data is generated by performing predetermined logic operation on one of the input signal and the data from another neighboring unit logic circuit, and upon receiving stopping setting information, stopping between the logic operation section and data processing section is controlled based on the stopping setting information, so that it is possible to provide a more versatile programmable logic circuit.

An eighth aspect of the present invention adopts a configuration where, in the seventh aspect of the present invention, the logic operation section further comprises a logic cell that performs predetermined logic operation on one of the input signals and the data from the another neighboring unit logic circuit and generates the data, the logic cell having functions that are changeable based on the first setting information.

According to this configuration, the same effects as for the seventh aspect of the present invention are possible.

A ninth aspect of the present invention adopts a configuration where, in the sixth aspect of the present invention, the data processing section further comprises a cross-connecting switch that generates data by carrying out arrangement, duplication and inversion processing on the data from the logic operation section based on the second setting information.

According to this configuration, the same effects as for the sixth aspect of the present invention are possible.

A tenth aspect of the present invention adopts a configuration where, in the ninth aspect of the present invention, the data processing section comprises a flip-flop that holds the data from the cross-connecting switch and supplies the data to the output signal control section as the output signals.

According to this configuration, the same effects as for the ninth aspect of the present invention are possible.

An eleventh aspect of the present invention adopts a configuration having a plurality of unit logic circuits connected in parallel, an input signal control section supplying input signals received from outside to the plurality of unit logic circuits, and an output signal control section supplying output signals of the plurality of unit logic circuits to outside, the input signal control section comprising: a section supplying a control signal to the plurality of unit logic circuits based on the input signal, and a section supplying index information to the plurality of unit logic circuits at the time of receiving an index designation signal, each of the plurality of unit logic circuits comprising: a logic operation section capable of changing functions based on any of the first setting information and carrying out predetermined logic operation on the input signal, a data processing section generating data by carrying out arrangement, duplication and inversion processing on the data from the logic operation section based on any of the second setting information and providing the data to the output signal control section as the output signals, a storage section storing the first and second setting information, and a memory control section storing a lead position address indicating the lead position of storage position addresses of the first and second setting information at the storage section based on either the control signal or index information at the time of receiving either the control signal or the index information, where each of the plurality of unit logic circuits changes the order of some or all of the functions of the logic operation section and the data processing section based on either of the first and second setting information read out sequentially from the storage section based on the lead position address stored in the memory control section and carries out circuit operations in a predetermined order.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

A twelfth aspect of the present invention adopts a configuration where, in the eleventh aspect of the present invention, the logic operation section further comprises a logic cell capable of changing functions based on the first setting information, carrying out predetermined logic operation on the input signals, and generating the data.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

A thirteenth aspect of the present invention adopts a configuration where, in the eleventh aspect of the present invention, the data processing section further comprises a cross-connecting switch generating the data by carrying out arrangement, duplication and inversion processing on the data from the logic operation section based on the second setting information.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

A fourteenth aspect of the present invention adopts a configuration where, in the thirteenth aspect of the present invention, the data processing section comprises a flip-flop holding the data from the cross-connecting switch and supplying the data to the output signal control section as the output signals.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

A fifteenth aspect of the present invention adopts a configuration having a plurality of unit logic circuits connected in parallel; a connecting section that connects one unit logic circuit and another unit logic circuit neighboring the one unit logic circuit in physical arrangement in the plurality of unit logic circuits; an input signal control section that supplies input signals received from outside to the plurality of unit logic circuits; and an output signal control section that supplies output signals of the plurality of unit logic circuits to outside, the input signal control section comprising: a section that supplies a control signal to the plurality of unit logic circuits based on the input signal; and a section that supplies index information to the plurality of unit logic circuits at the time of receiving an index designation signal, and each of the plurality of unit logic circuits comprising: a logic operation section that performs predetermined logic operation on the input signal or data from the another neighboring unit logic circuit and generates data, the logic operation section having functions changeable based on any of the first setting information; a data processing section that generates data by carrying out arrangement, duplication and inversion processing on the data from the logic operation section based on any of the second setting information and provides the data to the output signal control section as the output signals; a storage section that stores the first and second setting information; and a memory control section that stores a lead position address indicating the lead position of storage position addresses of the first and second setting information at the storage section based on one of the control signal and index information at the time of receiving one of the control signal and the index information, where each of the plurality of unit logic circuits sequentially changes some or all of the functions of the logic operation section and the data processing section based on one of the first and second setting information read out sequentially from the storage section based on the lead position address stored in the memory control section and carries out predetermined operations of a sequential circuit.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

A sixteenth aspect of the present invention adopts a configuration where, in the fifteenth aspect of the present invention, the logic operation section further comprises a logic cell that performs predetermined logic operation on the input signals and the data from the another neighboring unit logic circuit and generates the data, the logic cell having functions changeable based on the first setting information.

According to this configuration, each of the plurality of unit logic circuits sequentially changes some or all of the functions of the logic operation section and the data processing section based on the first and second setting information read out sequentially from the storage section and carries out predetermined operations of a sequential circuit, so that it is possible to provide a low-cost programmable logic circuit having a high implementation area efficiency capable of bringing about high-speed, large scale logic circuits.

A seventeenth aspect of the present invention adopts a configuration where, in the fifteenth aspect of the present invention, the data processing section further comprises a cross-connecting switch that generates the data by carrying out arrangement, duplication and inversion processing on the data from the logic operation section based on the second setting information.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

An eighteenth aspect of the present invention adopts a configuration where, in the seventeenth aspect of the present invention, the data processing section comprises a flip-flop holding the data from the cross-connecting switch and supplying the data to the output signal control section as the output signals.

According to this configuration, each of the plurality of unit logic circuits sequentially changes some or all of the functions of the logic operation section and the data processing section based on the first and second setting information read out sequentially from the storage section, and carries out predetermined operations of a sequential circuit, so that it is possible to provide a low-cost programmable logic circuit having a high implementation area efficiency capable of bringing about high-speed, large scale logic circuits.

The present application is based on Japanese Patent Application No. 2004-035042 and 2004-035043, filed on Feb. 12, 2004, the entire content of which is expressly incorporated by reference herein.

INDUSTRIAL APPLICABILITY

The present invention is applicable to control apparatus such as controlling electronic apparatus.

FIG. 1
USER CIRCUIT 108
USER CLOCK SIGNAL 110
CLOCK GENERATING CIRCUIT 107
INPUT/OUTPUT CONTROL SECTION 103
INTERNAL CLOCK SIGNAL 109
OUTPUT BUS 106
INPUT BUS 105
CONTROL BUS 104
DATA BUS 111
PROCESSOR ELEMENT 101
MEMORY APPARATUS 102

FIG. 2
OUTPUT BUS 106
INPUT BUS 105
CONTROL BUS 104
DATA BUS 111
Upper Processor Element
LOGIC ELEMENT 200
Lower Processor Element
DATA BUS INPUT
PROCESSOR ELEMENT 101
MEMORY CONTROL SECTION 201
MEMORY APPARATUS 102

FIG. 3
OUTPUT BUS 106
INPUT BUS 105
CONTROL BUS 104
DATA BUS 111
LOGIC CELL 300
INTERNAL CLOCK SIGNAL 109
UPPER LOGIC ELEMENT 200
CROSS-CONNECTING SWITCH 301
LOWER LOGIC ELEMENT 200
PROCESSOR ELEMENT 101
FLIP-FLOP 302
LOGIC ELEMENT 200
MEMORY CONTROL SECTION 201
MEMORY APPARATUS 102

FIG. 4
SETTING INFORMATION
LCC: LOGIC CELL SETTING INFORMATION
CROSS-CONNECTING SWITCH CONNECTION INFORMATION
INVERSION CONTROL INFORMATION
ADDRESS
STORAGE ADDRESS INFORMATION
SETTING INFORMATION
MEMORY APPARATUS 102

FIG. 5
LOGIC CELL 300
SETTING INFORMATION

FIG. 6
INPUT DATA
SETTING INFORMATION

FIG. 7
CROSS-CONNECTING SWITCH 301
INTERCONNECTING SECTION 700
OUT1
OUT2
SETTING INFORMATION

FIG. 8
SETTING INFORMATION
OUTPUT DATA

FIG. 9
USER CLOCK SIGNAL 110
INTERNAL CLOCK SIGNAL 109
INITIALIZATION SIGNAL 900
INTERNAL INITIALIZATION SIGNAL 901
INTERNAL INITIALIZATION SIGNAL 902
READ-OUT SIGNAL 903
ADDRESS 904
READ-OUT DATA 905
HOLD DATA 906
STORAGE POSITION ADDRESS 907

FIG. 10
USER CLOCK SIGNAL 110
INTERNAL CLOCK SIGNAL 109
ACTIVATION SIGNAL 1000
PROCESSING DATA 1001
INTERNAL ACTIVATION SIGNAL 1002
INTERNAL PROCESSING DATA 1003
INTERNAL ACTIVATION SIGNAL 1004
LOGIC PROCESSING DATA 1005
READ-OUT SIGNAL 903
ADDRESS 904
READ-OUT DATA 905
HOLD DATA 906
STORAGE POSITION ADDRESS 907

FIG. 11
INPUT DATA
SETTING INFORMATION

FIG. 12
INPUT DATA
SETTING INFORMATION
HOLD TIMING TO FLIP-FLOP
LOGIC CELL 300
Data for Results
CYCLE 1
CYCLE 2
CYCLE 3
CYCLE 4
CYCLE 5
CYCLE 6

FIG. 13
Data for Results
CYCLE 1, 2
CYCLE 3
CYCLE 4
CYCLE 5
CYCLE 6

FIG. 14
JUMP SETTING INFORMATION 1400
CODE 1401 INDICATING A JUMP
SELECTION CODE 1402
JUMP DESTINATION ADDRESS 1403
JUMP DESTINATION ADDRESS 1404

FIG. 15
PROCESSING CIRCUIT 1500
CIRCUIT
SELECTOR 1501

FIG. 16
CLOCK CYCLE
PROCESSING FOR CERTAIN PROCESSOR ELEMENT
PROCESSING FOR OTHER PROCESSOR ELEMENT
PROCESSING FOR OTHER PROCESSOR ELEMENT
CIRCUIT C
CIRCUIT A
CIRCUIT B
SELECTOR
OUTPUT
PROCESSING COMPLETE IN 7 CYCLES
THREE PROCESSOR ELEMENTS REQUIRED

FIG. 17
CLOCK CYCLE
PROCESSING FOR CERTAIN PROCESSOR ELEMENT
PROCESSING FOR OTHER PROCESSOR ELEMENT
PROCESSING FOR OTHER PROCESSOR ELEMENT
CIRCUIT C
JUMP
CIRCUIT B
OUTPUT
ONE PROCESSOR ELEMENT REQUIRED
PROCESSING COMPLETE IN 14 CYCLES

FIG. 18
PROCESSING CIRCUIT 1800
CIRCUIT

FIG. 19
READ-OUT SEQUENCE
ADDRESS 10
ADDRESS 50
ADDRESS 70
ADDRESS 90
ADDRESS 130
ADDRESS 150

CIRCUIT A
CIRCUIT B
CIRCUIT C
CIRCUIT A
CIRCUIT D

FIG. 20
READ-OUT SEQUENCE
ADDRESS 10
ADDRESS 50
ADDRESS 51
ADDRESS 71
ADDRESS 91
ADDRESS 92
ADDRESS 112
CIRCUIT A
JUMP: TO ADDRESS 51 OR 92
CIRCUIT B
CIRCUIT C
JUMP: TO ADDRESS 10
CIRCUIT D

FIG. 21
STOPPING SETTING INFORMATION 2100
CODE 2101 INDICATING A JUMP
CODE 2102 INDICATING A STOP
NUMBER OF STOP CYCLES 2103

FIG. 22
USER CIRCUIT 108
USER CLOCK SIGNAL 110
CLOCK GENERATING CIRCUIT 107
INPUT/OUTPUT CONTROL SECTION 103
INTERNAL CLOCK SIGNAL 109
OUTPUT BUS 106
INPUT BUS 105
CONTROL BUS 104
INDEX BUS 2201
PROCESSOR ELEMENT 101
MEMORY APPARATUS 102

FIG. 23
OUTPUT BUS 106
INPUT BUS 105
CONTROL BUS 104
INDEX BUS 2201
Upper Processor Element
LOGIC ELEMENT 200
Lower Processor Element
PROCESSOR ELEMENT 101
MEMORY CONTROL SECTION 201
MEMORY APPARATUS 102

FIG. 24
OUTPUT BUS 106
INPUT BUS 105
INDEX BUS 2201
INTERNAL CLOCK SIGNAL 109
LOGIC CELL 300
UPPER LOGIC ELEMENT 200
CROSS-CONNECTING SWITCH 301
LOWER LOGIC ELEMENT 200
LOGIC ELEMENT 200
FLIP-FLOP 302
SETTING INFORMATION
MEMORY CONTROL SECTION 201

FIG. 25
SETTING INFORMATION
LCC: LOGIC CELL SETTING INFORMATION

CROSS-CONNECTING SWITCH CONNECTION INFORMATION
INVERSION CONTROL INFORMATION
ADDRESS
STORAGE ADDRESS INFORMATION
SETTING INFORMATION
MEMORY APPARATUS 102

The invention claimed is:

1. A programmable logic circuit comprising:
a plurality of unit logic circuits connected in parallel;
an input signal control section that supplies input signals received from outside to the plurality of unit logic circuits; and
an output signal control section that supplies output signals of the plurality of unit logic circuits to outside,
each of the plurality of unit logic circuits comprising:
a logic operation section that performs predetermined logic operation on the input signals and generates data, said logic operation section having functions that are changeable based on first setting information;
a data processing section that generates data by carrying out arrangement, duplication and inversion processing on the data from the logic operation section based on second setting information, and provides the data to the output signal control section as output signals;
a storage section that stores the first and second setting information; and
a memory control section that takes control by receiving jump setting information, reading out either the first or the second setting information of the storage section based on the jump setting information and providing the setting information to the logic operation circuit and the data processing section,
wherein each of the plurality of unit logic circuits sequentially changes some or all of the functions of the logic operation section and the data processing section based on the first and second setting information read out sequentially from the storage section and carries out predetermined operations of a sequential circuit.

2. A programmable logic circuit comprising:
a plurality of unit logic circuits connected in parallel;
an input signal control section that supplies input signals received from outside to the plurality of unit logic circuits; and
an output signal control section that supplies output signals of the plurality of unit logic circuits to outside,
each of the plurality of unit logic circuits comprising:
a logic operation section that performs predetermined logic operation on the input signal and generates data, said logic operation section having functions that are changeable based on first setting information;
a data processing section that generates data by carrying out arrangement, duplication and inversion processing on the data from the logic operation section based on the second setting information, and provides the data to the output signal control section as output signals;
a storage section that stores the first and second setting information; and
a memory control section that receives stopping setting information and controls stopping between the logic operation section and the data processing section based on the stopping setting information,
wherein each of the plurality of unit logic circuits sequentially changes some or all of the functions of the logic operation section and the data processing section based on the first and second setting information read out sequentially from the storage section and carries out predetermined operations of a sequential circuit.

3. The programmable logic circuit according to claim 1, wherein the logic operation section further comprises a logic cell that performs predetermined logic operation on the input signals and generates data, said logic cell having functions that are changeable based on the first setting information.

4. The programmable logic circuit according to claim 2, wherein the logic operation section further comprises a logic cell that performs predetermined logic operation on the input signals and generates data, said logic cell having functions that are changeable based on the first setting information.

5. The programmable logic circuit according to claim 1, wherein the data processing section further comprises a cross-connecting switch that generates data by carrying out arrangement, duplication and inversion processing on the data from the logic operation section based on the second setting information.

6. The programmable logic circuit according to claim 2, wherein the data processing section further comprises a cross-connecting switch that generates data by carrying out arrangement, duplication and inversion processing on the data from the logic operation section based on the second setting information.

7. The programmable logic circuit according to claim 5, wherein the data processing section comprises a flip-flop that holds the data from the cross-connecting switch and supplies the data to the output signal control section as the output signals.

8. The programmable logic circuit according to claim 6, wherein the data processing section comprises a flip-flop that holds the data from the cross-connecting switch and supplies the data to the output signal control section as the output signals.

9. The programmable logic circuit according to claim 1, further comprising a connecting section that connects one unit logic circuit in the plurality of unit logic circuits and another unit logic circuit neighboring the one unit logic circuit in physical arrangement,
wherein the logic operation section performs predetermined logic operation on one of the input signal and data from the another neighboring unit logic circuit and generates data, said logic operation section having functions that are changeable based on first setting information.

10. The programmable logic circuit according to claim 2, further comprising a connecting section that connects one unit logic circuit in the plurality of unit logic circuits and another unit logic circuit neighboring the one unit logic circuit in physical arrangement,
wherein the logic operation section performs predetermined logic operation on one of the input signal and data from the another neighboring unit logic circuit and generates data, said logic operation section having functions that are changeable based on first setting information.

11. The programmable logic circuit according to claim 10, wherein the logic operation section further comprises a logic cell that performs predetermined logic operation on the input signals and generates data, said logic cell having functions that are changeable based on the first setting information.

12. The programmable logic circuit according to claim 5, wherein the data processing section comprises a flip-flop that holds the data from the cross-connecting switch and supplies the data to the output signal control section as the output signals.

13. The programmable logic circuit according to claim 6, wherein the data processing section comprises a flip-flop that holds the data from the cross-connecting switch and supplies the data to the output signal control section as the output signals.

14. A programmable logic circuit comprising:
a plurality of unit logic circuits connected in parallel;
an input signal control section that supplies input signals received from outside to the plurality of unit logic circuits; and
an output signal control section that supplies output signals of the plurality of unit logic circuits to outside, the input signal control section comprising:
a section that supplies a control signal to the plurality of unit logic circuits based on the input signal; and
a section that supplies index information to the plurality of unit logic circuits at the time of receiving an index designation signal,
each of the plurality of unit logic circuits comprising:
a logic operation section that performs predetermined logic operation on the input signal and generates data, said logic operation section having functions that are changeable based on any of the first setting information;
a data processing section that carries out arrangement, duplication, and inversion processing on the data from the logic operation section based on any of the second setting information, generates data and provides the data to the output signal control section as the output signals;
a storage section storing the first and second setting information; and
a memory control section that stores a lead position address indicating the lead position of storage position addresses of the first and second setting information at the storage section based on one of the control signal and index information at the time of receiving one of the control signal and the index information,
wherein each of the plurality of unit logic circuits sequentially changes some or all of the functions of the logic operation section and the data processing section based on either the first or second setting information read out sequentially from the storage section based on the lead position address stored in the memory control section and carries out predetermined operations of a sequential circuit.

15. The programmable logic circuit according to claim 14, wherein the logic operation section further comprises a logic cell that performs predetermined logic operation on the input signals and generates the data, said logic cell having functions that are changeable based on the first setting information.

16. The programmable logic circuit according to claim 14, wherein the data processing section further comprises a cross-connecting switch that generates data by carrying out arrangement, duplication and inversion processing on the data from the logic operation section based on the second setting information.

17. The programmable logic circuit according to claim 16, wherein the data processing section comprises a flip-flop that holds the data from the cross-connecting switch and supplies the data to the output signal control section as the output signals.

18. The programmable logic circuit according to claim 14, further comprising a connecting section that connects one unit logic circuit in the plurality of unit logic circuits and another unit logic circuit neighboring the one unit logic circuit in physical arrangement,
wherein the logic operation section performs predetermined logic operation on one of the input signal and data from the another neighboring unit logic circuit and generates data, said logic operation section having functions that are changeable based on first setting information.

* * * * *